(12) United States Patent
Marini

(10) Patent No.: US 11,934,745 B2
(45) Date of Patent: Mar. 19, 2024

(54) DESIGNING A PART FEATURING A PROTRUSION OR A DEPRESSION

(71) Applicant: DASSAULT SYSTEMES, Velizy-Villacoublay (FR)

(72) Inventor: Laurent Marini, Velizy-Villacoublay (FR)

(73) Assignee: Dassault Systemes, Velizy-Villacoublay (FR)

(*) Notice: Subject to any disclaimer, the term of this patent is extended or adjusted under 35 U.S.C. 154(b) by 223 days.

(21) Appl. No.: 16/780,655

(22) Filed: Feb. 3, 2020

(65) Prior Publication Data

US 2020/0257833 A1 Aug. 13, 2020

(30) Foreign Application Priority Data

Feb. 1, 2019 (EP) ..................................... 19305126

(51) Int. Cl.
*G06G 7/48* (2006.01)
*G06F 30/12* (2020.01)
(Continued)

(52) U.S. Cl.
CPC .............. *G06F 30/17* (2020.01); *G06F 30/12* (2020.01); *G06F 30/15* (2020.01); *G06T 17/00* (2013.01); *G06T 2200/24* (2013.01)

(58) Field of Classification Search
CPC .......... G06F 30/17; G06F 30/12; G06F 30/15; G06F 30/00; G06T 17/00; G06T 2200/24
See application file for complete search history.

(56) References Cited

U.S. PATENT DOCUMENTS 8,244,508 B1  8/2012 Dean et al.
8,872,820 B2  10/2014 Bohman et al.
(Continued)

FOREIGN PATENT DOCUMENTS

EP  2 028 623 A1  2/2009
EP  1 710 720 B1  7/2009
(Continued)

OTHER PUBLICATIONS

Li, Jiping, et al. "Automatic small depression feature recognition from solid B-rep models for meshing." 2011 International Conference on Electrical and Control Engineering. IEEE, 2011.*
(Continued)

*Primary Examiner* — Rehana Perveen
*Assistant Examiner* — Nithya J. Moll
(74) *Attorney, Agent, or Firm* — Oblon, McClelland, Maier & Neustadt, L.L.P.

(57) ABSTRACT

The disclosure notably relates to a computer-implemented method for designing, with a CAD system, a 3D modeled object representing a mechanical part. The method includes obtaining a B-rep representing the mechanical part. The B-Rep has faces and edges. The method further includes obtaining a first set of faces and a feature type. The feature type is either a depression feature type or a protrusion feature type. The method further comprises, automatically by the CAD system, recognizing a second set of faces within the first set of faces. The second set of faces represents a feature of the provided feature type. This constitutes an improved method for designing a mechanical part.

9 Claims, 16 Drawing Sheets

(51) Int. Cl.
    *G06F 30/15*     (2020.01)
    *G06F 30/17*     (2020.01)
    *G06T 17/00*     (2006.01)

(56) References Cited

U.S. PATENT DOCUMENTS

| | | | |
|---|---|---|---|
| 2011/0282632 A1* | 11/2011 | Rameau | G06T 17/10 703/1 |
| 2014/0184594 A1 | 7/2014 | Janvier | |
| 2017/0160726 A1 | 6/2017 | Rameau et al. | |

FOREIGN PATENT DOCUMENTS

| | | |
|---|---|---|
| EP | 2 521 057 A1 | 11/2012 |
| EP | 3 179 389 A1 | 6/2017 |
| EP | 3 340 084 A1 | 6/2018 |
| EP | 3 460 760 A1 | 3/2019 |
| JP | 2009-53864 A | 3/2009 |
| JP | 2014/509430 A | 4/2014 |
| WO | WO 2016/178106 A1 | 11/2016 |

OTHER PUBLICATIONS

Zhu, H., and Chia-Hsiang Menq. "B-rep model simplification by automatic fillet/round suppressing for efficient automatic feature recognition." Computer-Aided Design 34.2 (2002): 109-123.*

Sunil, V. B., Rupal Agarwal, and S. S. Pande. "An approach to recognize interacting features from B-Rep CAD models of prismatic machined parts using a hybrid (graph and rule based) technique." Computers in Industry 61.7 (2010): 686-701.*

Manfredo P. Do Carmo; "Differential Geometry of Curves and Surfaces"; Prentice-Hall, Inc.; Englewood Cliffs, New Jersey: 1976; (511 pgs.).

Extended Search Report dated Aug. 12, 2019 in European Patent Application No. 19305126.5-1224; 10 pages.

Extended Search Report dated Jan. 27, 2020 in European Patent Application No. 19305916.9-1224; 15 pages.

T. Lim, et al.; "Edge-Based Identification of DP-Features on Free-Form Solids"; IEEE Transactions on Pattern Analysis and Machine Intelligence, IEEE Computer Society, USA; vol. 27, No. 6, Jun. 1, 2005; XP011131012; 10 pgs.

Chunjie Zhang, et al.; "Feature Extraction from Freeform Molded Parts for Moldability Analysis"; The International Journal of Advanced Manufacturing Technology, Springer, Berlin DE; vol. 48, No. 1-4; Sep. 3, 2009; XP019797880; ISSN:1433-3015; 10 pgs.

Jiing-Yih LAI, et al.; "Recognition of Depression and Protrusion Features on B-rep Models Based on Virtual Loops"; Computer-Aided Design and Applications; vol. 13, No. 1; Aug. 28, 2015; XP055658648; 13 pgs.

"Onshape—Product Development Platform"; https://www.onshape.com; retrieved Jul. 3, 2020; 11 pgs.

"Commercial CAD System NX9"; https://.automation.siemens.com/global/en/products/nx/; retrieved Jul. 3, 2020; 9 pgs.

"Design Engineering CATIA—Dassault Systemes"; https:/www.3ds.com/products-services/catia/?wockw=card_content_cta_1_url3A"https%3A%2Fblogs.3ds.com%2Fcatia%2F; retrieved Jul. 3, 2020; 11 pgs.

* cited by examiner

1 → Plane
2 → Cylindrical surface
3 → Cylindrical surface
4 → Circle 1
5 → Circle 1
6 → Circle 2
7 → Circle 2
8 → Line 1
13 → Line 2
10 → Point 1
11 → Point 2
12 → Point 3
9 → Point 4

DESIGNING A PART FEATURING A PROTRUSION OR A DEPRESSION

CROSS-REFERENCE TO RELATED APPLICATIONS

This application claims priority under 35 U.S.C. § 119 or 365 to European Application No. EP 19305126.5, filed Feb. 1, 2019. The entire contents of the above application(s) are incorporated herein by reference.

FIELD OF THE INVENTION

The disclosure relates to the field of computer programs and systems, and more specifically to a method, system and program for designing a 3D modeled object representing a mechanical part.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

In the mechanical design context, a depression (resp. a protrusion) is a functional feature represented by faces and edges of a B-rep representing a mechanical part, and which can be very complex. Internal details may involve convex and concave edges of the B-rep. These details are hidden from the user due to the neighboring geometry and view point orientation. For these reasons, it can be very difficult to select all faces of a B-rep which represent a complex depression (resp. protrusion).

Existing methods for protrusion or depression recognition and/or selection are not efficient. These methods suffer from a lack of efficiency and/or ergonomics.

Within this context, there is still a need for an improved method for designing a mechanical part.

SUMMARY OF THE INVENTION

It is therefore provided a computer-implemented method for designing, with a CAD system, a 3D modeled object representing a mechanical part. The method comprises providing a B-rep representing the mechanical part. The B-rep has faces and edges. The method further comprises providing a first set of faces and a feature type. The feature type is either a depression feature type or a protrusion feature type. The method further comprises, automatically by the CAD system, recognizing a second set of faces within the first set of faces. The second set of faces represents a feature of the provided feature type.

Such a method constitutes an improved method for designing a mechanical part.

Notably, the method allows the recognition of faces representing a depression feature or a protrusion feature in a B-rep representing a mechanical part. In other words, the method allows determining information relevant to mechanical design.

Furthermore, the method recognizes said faces automatically. In other words, the method does not involve user-actions for said recognition. The method is thus ergonomic.

In addition, the method proceeds in two steps, first by providing the first set of faces and second by recognizing the second set of faces within the first set of faces. This two-step approach improves robustness. Moreover, this two-step approach allows providing a first set in a rough manner, as the first set need not consist only of faces each representing the feature. Indeed, the automatic recognition may operate a filtering within the first set.

The method may comprise one or more of the following:
- the second set of faces forms a connection between one or more elementary subsets, where, a smooth skin being a face or a connected set of faces containing only smooth internal edges:
  - if the provided feature type is the depression feature type, an elementary subset is a connected set of one or more faces bounded by convex edges or round faces only and containing no convex internal edge and no round face, the elementary subset being either not a smooth skin or a smooth skin satisfying a concavity criterion; and/or
  - if the provided feature type is the protrusion feature type, an elementary subset is a connected set of one or more faces bounded by concave edges or fillet faces only and containing no concave internal edge and no fillet face, the elementary subset being either not a smooth skin or a smooth skin satisfying a convexity criterion;
- the second set of faces comprises all elementary subsets of the first set;
- each elementary subset is connected to at least one other elementary subset, two elementary subsets being connected if they share either only edges of a predetermined edge type or only faces of a predetermined face type, where:
  - if the provided feature type is the depression feature type, the predetermined edge type is the convex edge type and the predetermined face type is the round face type; and/or
  - if the provided feature type is the protrusion feature type, the predetermined edge type is the concave edge type and the predetermined face type is the fillet face type.
- a smooth skin bounded by convex edges or round faces only and containing no convex internal edge and no round face satisfies the concavity criterion if the smooth skin cannot be arbitrarily offset in the direction of its normal vector while remaining smooth;

a smooth skin bounded by concave edges or fillet faces only and containing no concave internal edge and no fillet face satisfies the convexity criterion if the smooth skin cannot be arbitrarily offset in the opposite direction of its normal vector while remaining smooth;
the recognizing comprises:
  determining one or more candidate elementary subsets, where:
    if the provided feature type is the depression feature type, a candidate elementary subset is a connected set of one or more faces bounded by convex edges or round faces only and containing no convex internal edge and no round face; and/or
    if the provided feature type is the protrusion feature type, a candidate elementary subset is a connected set of one or more faces bounded by concave edges or fillet faces only and containing no concave internal edge and no fillet face;
  the determining of the one or more candidate elementary subsets partitioning the first set of faces into faces which each belong to exactly one candidate elementary subset and faces which belong to no candidate elementary subset; and
  identifying the one or more elementary subsets among the
the determining of the one or more candidate elementary subsets includes iteratively visiting faces of the first set, where visiting a face comprises:
  determining whether the face is to be included in a candidate elementary subset; and
  if the face is to be included in the candidate elementary subset, including the face in the elementary subset and determining that the face is not to be visited again;
providing the first set of faces comprises:
  displaying the B-rep on a display of the CAD system; and
  selecting the first set of faces by graphical user-interaction;
the selecting of the first set of faces comprises:
  by graphical user-interaction, defining a closed curve on the display; and
  automatically by the CAD system, identifying each face of the B-rep of which projection on the display is entirely included inside the closed curve;
the selecting of the first set of faces further comprises, automatically by the CAD system:
  partitioning the identified faces into disjoint connected subsets of faces, where one and only one subset is the first set of faces; and
  discarding all other subsets;
the mechanical part is:
  a molded part;
  a machined part;
  a drilled part;
  a turned part;
  a forged part;
  a folded part;
if the feature type is the depression feature type, the feature of the provided feature type is:
  a mass reduction feature;
  a space reservation feature;
  a fixture feature;
  a tightness feature;
  an adjustment feature;
  a positioning feature;
  a mechanical joint feature;
  a cooling feature;
  a space reservation feature;
  a revolute or cylindrical mechanical joint feature;
  an assembly feature; and/or
  a stiffening feature; and/or
if the feature type is the protrusion feature type, the feature of the provided feature type is:
  a stiffening feature;
  a fixture feature;
  a positioning pin feature;
  a revolute or cylindrical mechanical joint feature;
  a support for all machined and drilled protrusions feature;
  an assembly feature; and/or
  a space reservation feature.

It is further provided a computer program comprising instructions for performing the method.

It is further provided a computer readable storage medium having recorded thereon the computer program.

It is further provided a system comprising a processor coupled to a memory and a display, the memory having recorded thereon the computer program.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
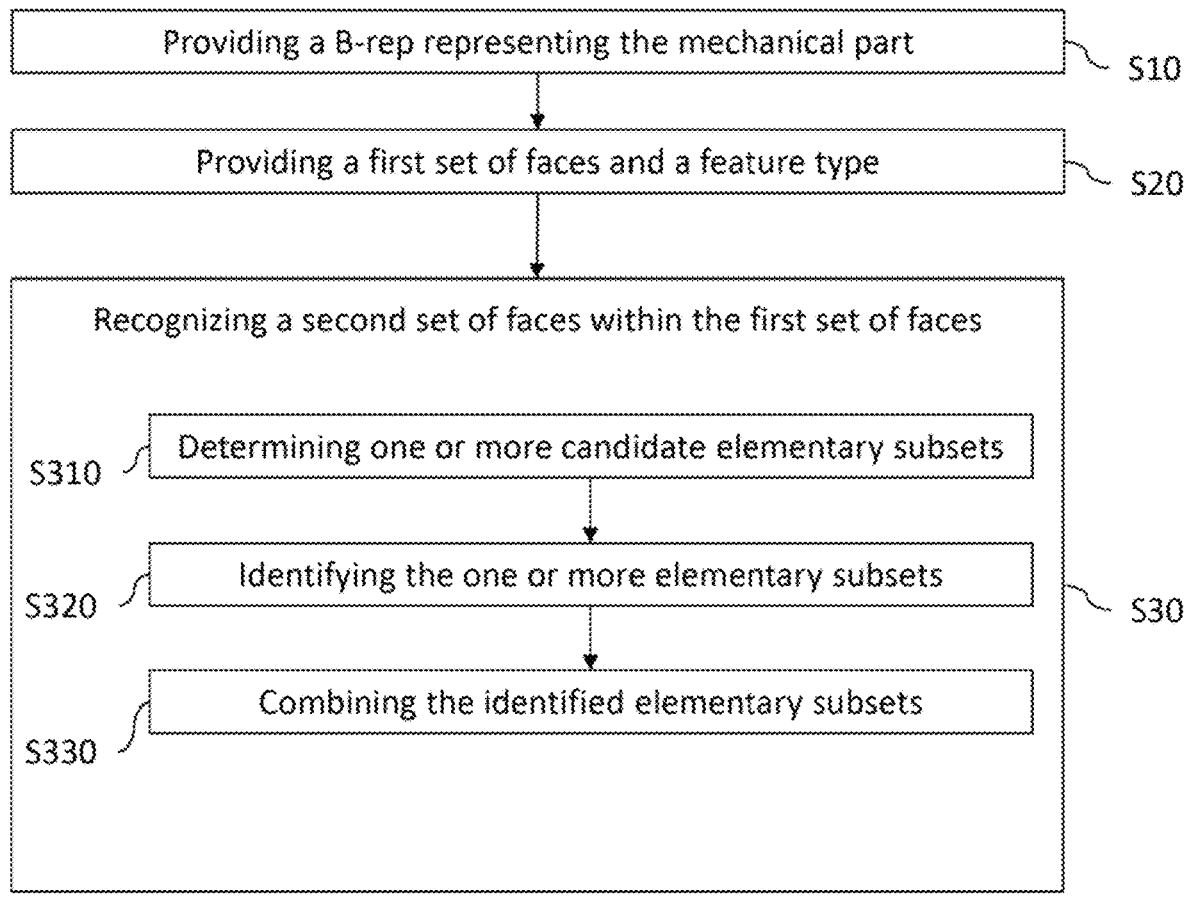
FIG. 1 shows a flowchart of an example of the method.

With reference to the flowchart of FIG. 1, it is proposed a computer-implemented method for designing, with a CAD system, a 3D modeled object representing a mechanical part. The method comprises providing S10 a B-rep representing the mechanical part. The B-rep has faces and edges. The method further comprises providing S20 a first set of faces and a feature type. The feature type is either a depression feature type or a protrusion feature type. The method further comprises, automatically by the CAD system, recognizing S30 a second set of faces within the first set of faces. The second set of faces represents a feature of the provided feature type.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

A typical example of computer-implementation of a method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database).

The method generally manipulates modeled objects. A modeled object is any object defined by data stored e.g. in the database. By extension, the expression "modeled object" designates the data itself. The system may be a CAD system, and modeled objects are defined by corresponding data. One may accordingly speak of CAD object.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

The 3D modeled object may represent the geometry of a product to be manufactured in the real world subsequent to the completion of its virtual design with for example a CAD software solution or CAD system, such as a (e.g. mechanical) part or assembly of parts (or equivalently an assembly of parts, as the assembly of parts may be seen as a part itself from the point of view of the method, or the method may be applied independently to each part of the assembly), or more generally any rigid body assembly (e.g. a mobile mechanism). A CAD software solution allows the design of products in various and unlimited industrial fields, including: aerospace, architecture, construction, consumer goods, high-tech devices, industrial equipment, transportation, marine, and/or offshore oil/gas production or transportation. The 3D modeled object designed by the method may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product, tire manufacturing product), an electromechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

In examples, the mechanical part designed by the method is one or a plausible combination of a molded part (i.e. a part manufactured by a molding manufacturing process), a machined part (i.e. a part manufactured by a machining manufacturing process), a drilled part (i.e. a part manufactured by a drilling manufacturing process), a turned part (i.e. a part manufactured by a turning manufacturing process), a forged part (i.e. a part manufactured by a forging manufacturing process), a stamped part (i.e. a part manufactured by a stamping manufacturing process) and/or a folded part (i.e. a part manufactured by a folding manufacturing process). The method is particularly efficient for designing such examples of mechanical parts which often comprise depression(s) and/or protrusion(s).

The notions of feature, depression feature type, protrusion feature type and geometry of a feature are now discussed. In the following, for the sake of conciseness, a feature of the depression feature type may be referred to as "a depression feature" and a feature of the protrusion feature type may be referred to as "a protrusion feature".

The mechanical part may be designed to fulfill a mechanical function, which is performed by one or more features. In examples, the mechanical function is performed by one feature. In examples, the mechanical function is decomposed into several mechanical functions each performed by a feature. A feature is a layout (e.g. an arrangement) of material that performs a mechanical function. The depression feature type may be a category of features, where each feature of the category is a layout of material having a shape of a depression. Additionally or alternatively, the protrusion feature type may be a category of features, where each feature of the category is a layout of material having a shape of a protrusion.

A feature has a geometry which may be a geometry corresponding to and/or representing and/or forming the layout of material that is the feature. The geometry of a feature may comprise (e.g. involve, e.g. be a combination of) several basic geometries. A basic geometry may be a linear extrusion. A linear extrusion may be a pad (which adds material). A linear extrusion may be a pocket (which removes material). A basic geometry may be a revolute. A revolute may be a shaft (which adds material). A revolute may be a groove (which removes material). A basic geometry may be a swept profile. A swept profile may be a rib (which adds material) and/or a stiffener (which adds material). A revolute may be a slot (which removes material).

The second set of faces represents a feature of the provided feature type. If the provided feature type is the depression feature type, the feature of the provided feature type may be one or a plausible combination of a mass reduction feature, a space reservation feature, a fixture feature, a tightness feature, an adjustment feature, a positioning feature, a mechanical joint feature, a cooling feature, a space reservation, a revolute or cylindrical mechanical joint feature, an assembly feature and/or a stiffening feature. Additionally or alternatively, if the feature type is the protrusion feature type, the feature of the provided feature type may be one or a plausible combination of a stiffening feature, a fixture feature, a positioning pin feature, a revolute or cylindrical mechanical joint feature, a support for all machined and drilled protrusions feature, an assembly feature, and/or a space reservation feature.

Examples of functions performed by examples of depression features represented by the second set of faces are now discussed.

In examples, the mechanical part is manufactured by a molding manufacturing process. In these examples, the depression feature represented by the second set of faces may be a mass reduction feature (i.e. performing a mass reduction function) and/or a space reservation feature (i.e. performing a space reservation function).

Additionally or alternatively, the mechanical part may be manufactured by a machining manufacturing process. In these examples, the depression feature represented by the second set of faces may be a mass reduction feature (i.e. performing a mass reduction function), a fixture feature (i.e. performing a fixture function), a tightness feature (i.e. performing a tightness function), an adjustment feature (i.e. performing an adjustment function), a positioning feature (i.e. performing a positioning function), a mechanical joint feature (i.e. performing a mechanical joint function), a cooling feature (i.e. performing a cooling function) and/or a space reservation feature (i.e. performing a space reservation function).

Additionally or alternatively, the mechanical part may be manufactured by a drilling manufacturing process. In these examples, the depression feature represented by the second set of faces may be a fixture feature (i.e. performing a fixture function), a positioning feature (i.e. performing a positioning function), a revolute or cylindrical mechanical joint feature (i.e. performing a revolute or cylindrical mechanical joint function), a cooling feature (i.e. performing a cooling function) and/or a space reservation feature (i.e. performing a space reservation function).

Additionally or alternatively, the mechanical part may be manufactured by a turning manufacturing process. In these examples, the depression feature represented by the second set of faces may be a revolute or cylindrical mechanical joint feature (i.e. performing a revolute or cylindrical mechanical joint function).

Additionally or alternatively, the mechanical part may be manufactured by a forging manufacturing process. In these examples, the depression feature represented by the second set of faces may be a mass reduction feature (i.e. performing a mass reduction function).

Additionally or alternatively, the mechanical part may be manufactured by a stamping manufacturing process. In these examples, the depression feature represented by the second set of faces may be an assembly feature (i.e. performing an assembly function), a stiffening feature (i.e. performing a stiffening function) and/or a space reservation feature (i.e. performing a space reservation function).

Additionally or alternatively, the mechanical part may be manufactured by a folding manufacturing process. In these examples, the depression feature represented by the second set of faces may be an assembly feature (i.e. performing an assembly function), a stiffening feature (i.e. performing a stiffening function) and/or a space reservation feature (i.e. performing a space reservation function).

Examples of functions performed by examples of protrusion features are now discussed.

In examples, the mechanical part is manufactured by a molding manufacturing process. In these examples, the protrusion feature represented by the second set of faces may be a stiffening feature (i.e. performing a stiffening function).

Additionally or alternatively, the mechanical part may be manufactured by a machining manufacturing process. In these examples, the protrusion feature represented by the second set of faces may be a fixture feature (i.e. performing a fixture function) and/or a positioning pin feature (i.e. performing a positioning pin function).

Additionally or alternatively, the mechanical part may be manufactured by a turning manufacturing process. In these examples, the protrusion feature represented by the second set of faces may be a revolute or cylindrical mechanical joint feature (i.e. performing a revolute or cylindrical mechanical joint function) and/or a positioning pin feature (i.e. performing a positioning pin function).

Additionally or alternatively, the mechanical part may be manufactured by a forging manufacturing process. In these examples, the protrusion feature represented by the second set of faces may be a stiffening feature (i.e. performing a stiffening function) and/or a support for all machined and drilled protrusion feature (i.e. performing a support for all machined and drilled protrusion function).

Additionally or alternatively, the mechanical part may be manufactured by a stamping manufacturing process. In these examples, the protrusion feature represented by the second set of faces may be an assembly feature (i.e. performing an assembly function), a stiffening feature (i.e. performing a stiffening function) and/or a space reservation feature (i.e. performing a space reservation function).

Additionally or alternatively, the mechanical part may be manufactured by a folding manufacturing process. In these examples, the protrusion feature represented by the second set of faces may be an assembly feature (i.e. performing an assembly function), a stiffening feature (i.e. performing a stiffening function) and/or a space reservation feature (i.e. performing a space reservation function).

Figure 16:
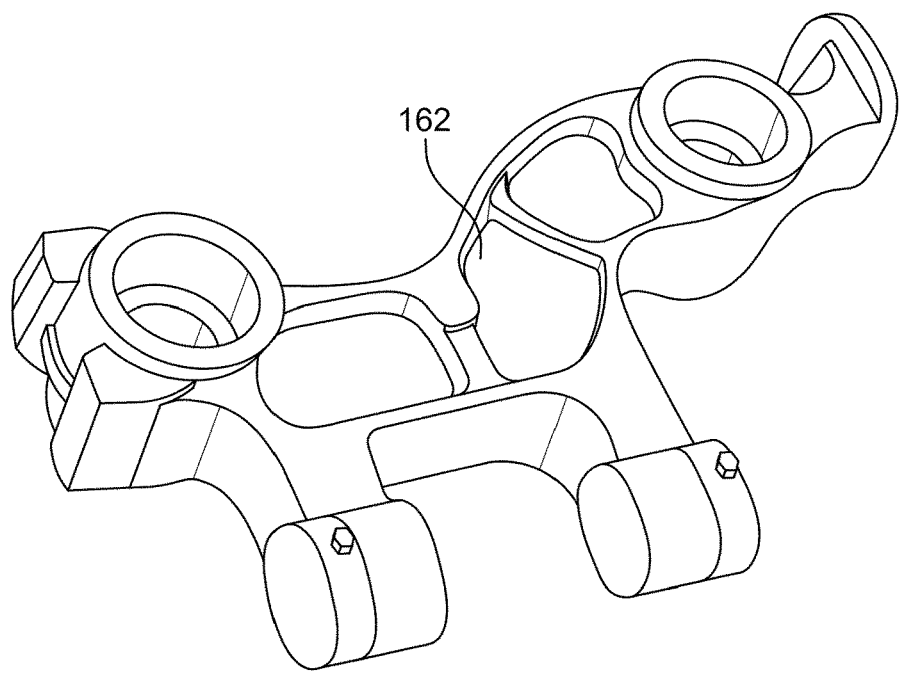
FIGS. 16, 17, 18, 19 and 20 show geometries of depression features and protrusion features on examples of mechanical parts designed by the method.
Figure 17:
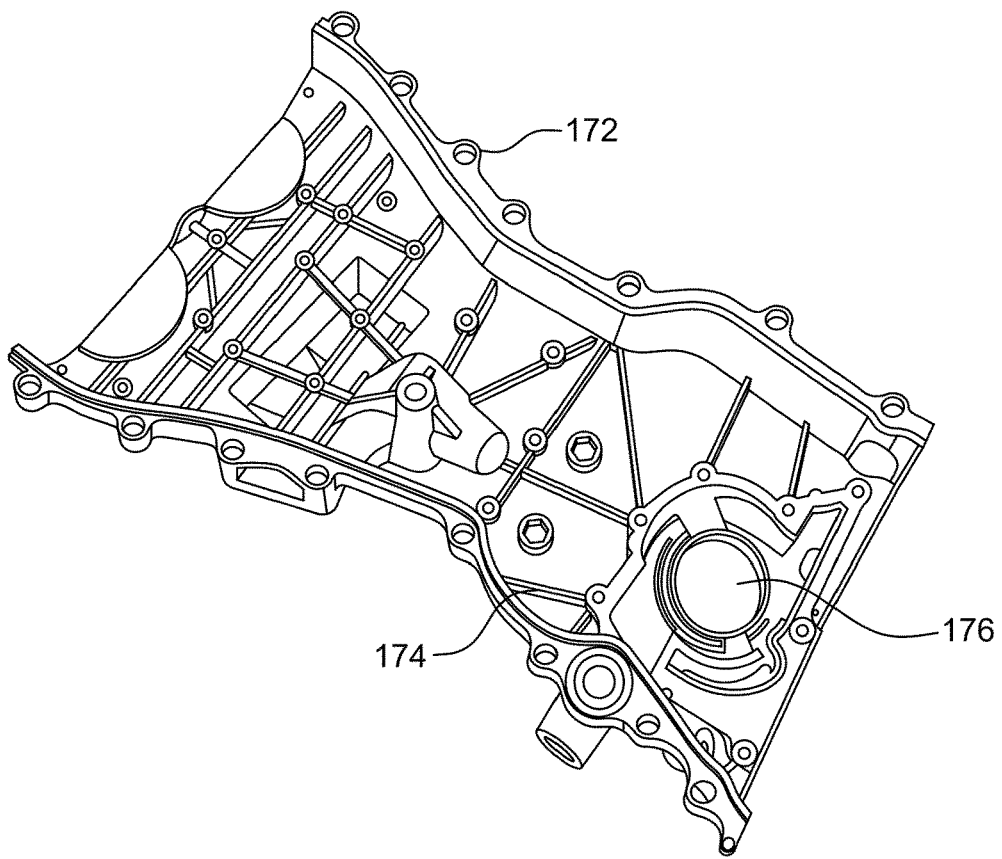
Figure 18:
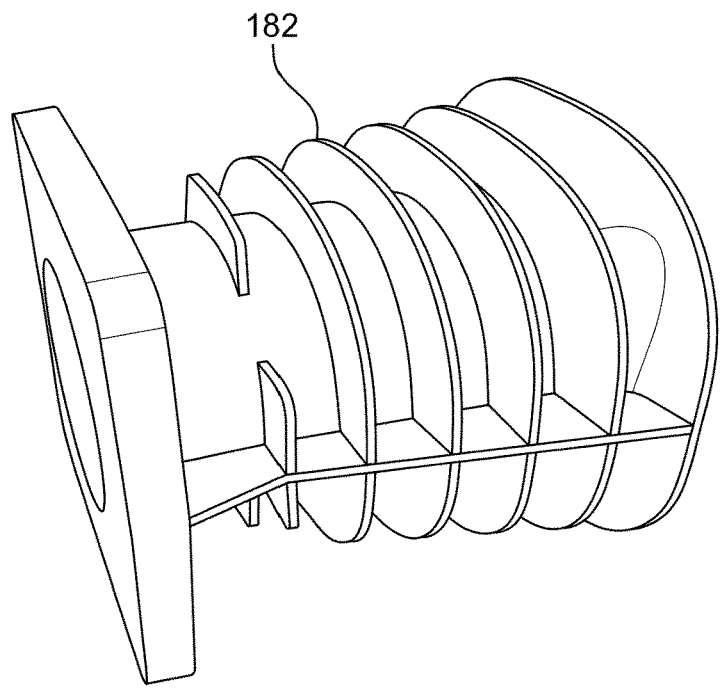
Figure 19:
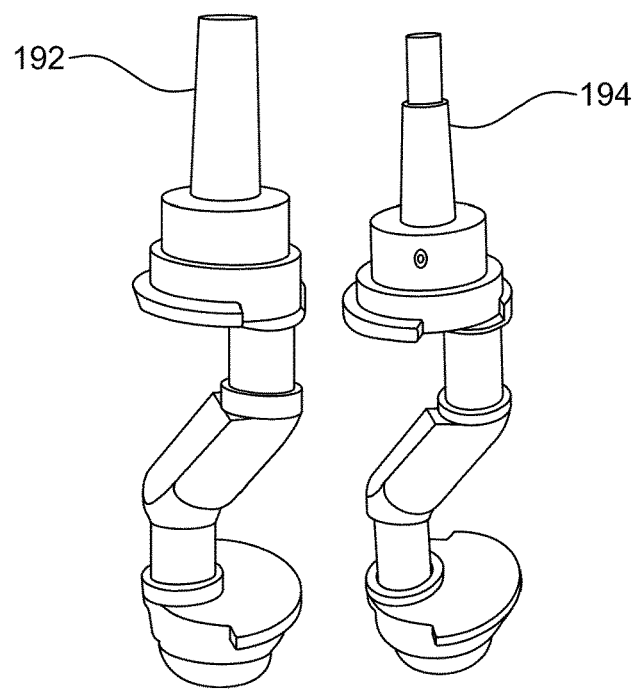
Figure 20:
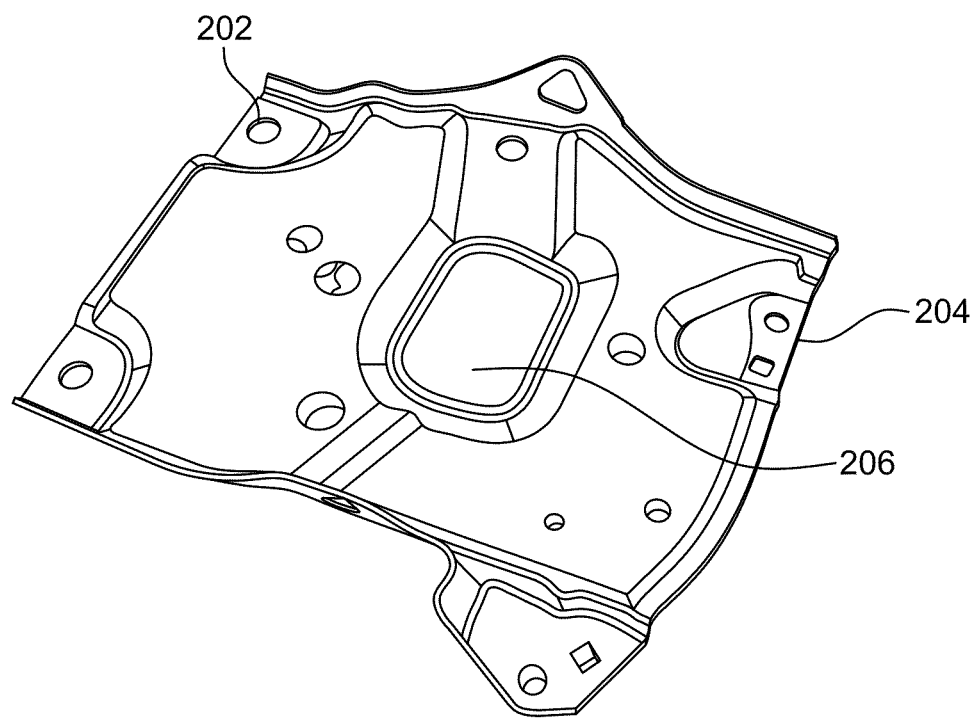

FIGS. 16-20 show examples of geometries of examples of depression features and protrusion features on examples of mechanical parts designed by the method. FIG. 16 shows the geometry 162 of a mass reduction depression feature on a forged part. FIG. 17 shows the geometry 172 of a fixture feature on a casted drilled machined part. The geometry 172 comprises the geometry of a fixture boss, which corresponds to the protruded part of the fixture feature, and the geometry of a fixture hole, which corresponds to the drilled part of the fixture feature. FIG. 17 further shows the geometry 174 of a stiffener protrusion feature on the casted drilled machined part. FIG. 17 further shows the geometry 176 of a positioning depression feature 176 on the casted drilled machined part. FIG. 18 shows the geometry 182 of a cooling protrusion feature on a casted machined part. FIG. 19 shows the geometry 192 of a support for a machined protrusion feature on a part to be machined and the geometry 194 of a mechanical joint protrusion feature obtained by machining the part. FIG. 20 shows two geometries 202, 204 of two respective positioning depression features on a stamped part. FIG. 20 further shows a space reservation depression feature on the stamped part.

Figure 2:
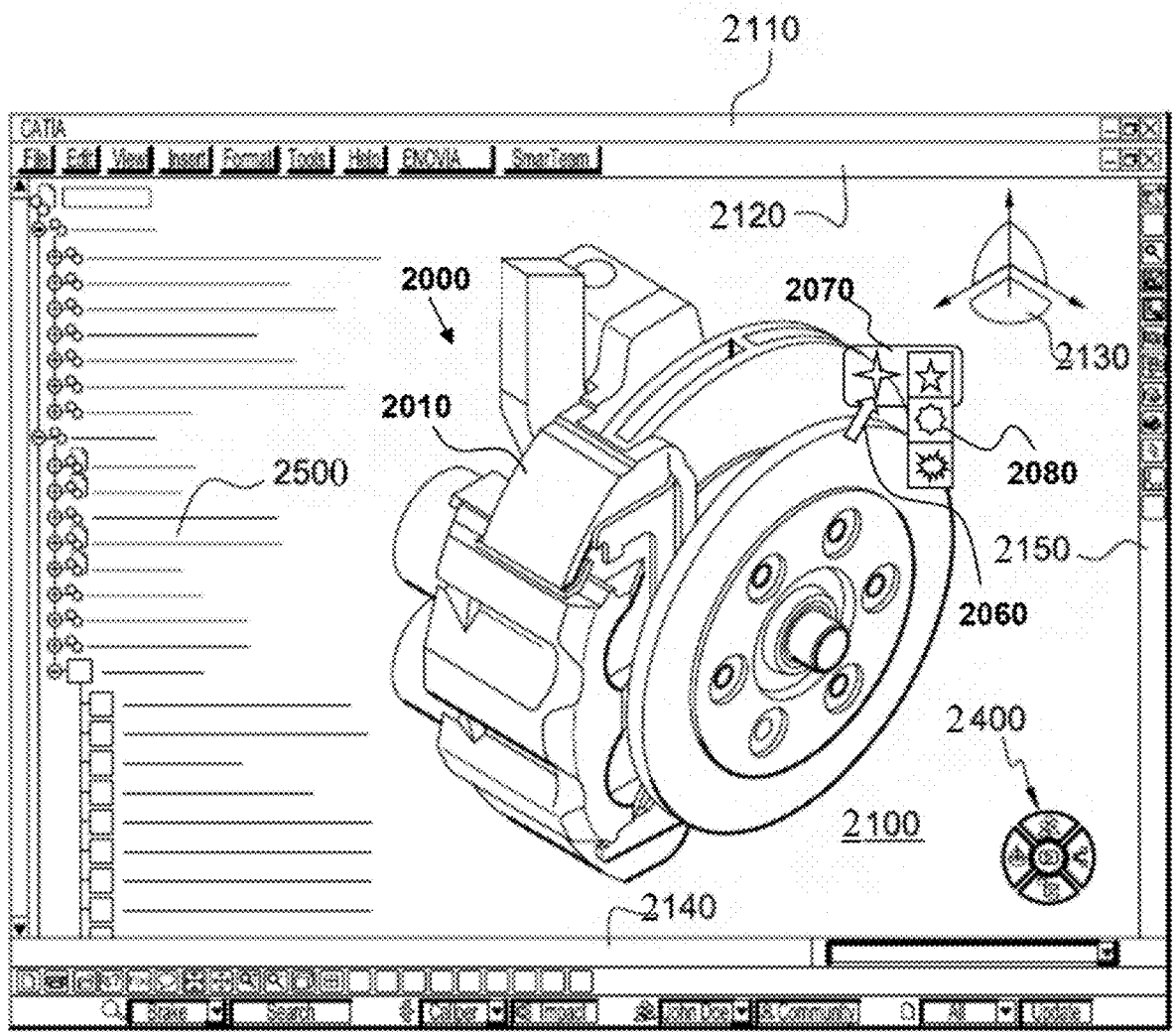
FIG. 2 shows an example of a graphical user interface of the system.

FIG. 2 shows an example of the GUI of the system, wherein the system is a CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen. The GUI may for example display data 2500 related to the displayed product 2000. In the example of the figure, the data 2500, displayed as a "feature tree", and their 3D representation 2000 pertain to a brake assembly including brake caliper and disc. A brake assembly such as the one represented by the 3D representation 2000 may be designed by the method. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 3:
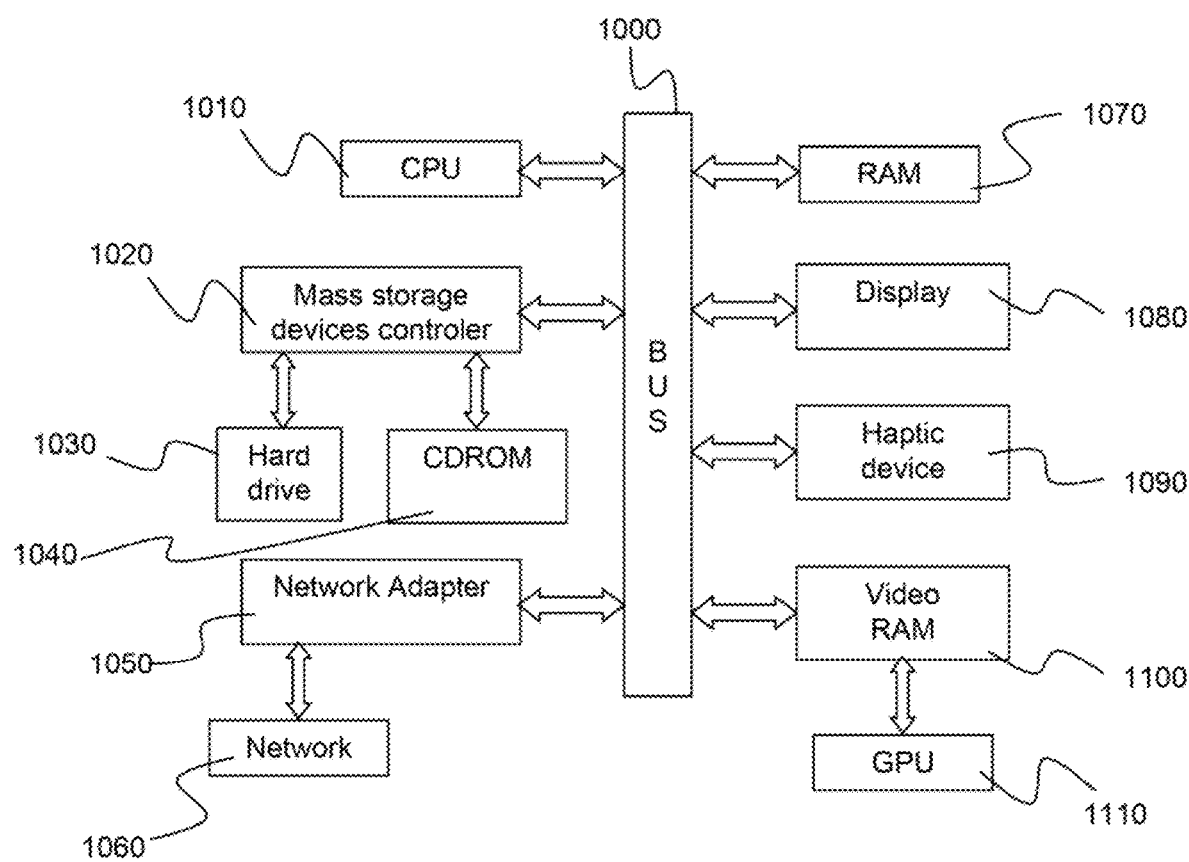
FIG. 3 shows an example of the system.

FIG. 3 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

"Designing a 3D modeled object" designates any action or series of actions which is at least part of a process of elaborating a 3D modeled object. Thus, the method may comprise creating the 3D modeled object from scratch. Alternatively, the method may comprise providing a 3D modeled object previously created, and then modifying the 3D modeled object.

The method may be included in a manufacturing process, which may comprise, after performing the method, producing a physical product corresponding to the modeled object. In any case, the modeled object designed by the method may represent a manufacturing object. The modeled object may thus be a modeled solid (i.e. a modeled object that represents a solid). The manufacturing object may be a product, such as a part, or an assembly of parts. Because the method improves the design of the modeled object, the method also improves the manufacturing of a product and thus increases productivity of the manufacturing process.

The providing S10 of the B-rep representing the mechanical part is now discussed.

The B-rep is a 3D representation of the mechanical part. Specifically, the B-rep (i.e. boundary representation) is a persistent data representation describing the 3D modeled object representing the mechanical part. The B-rep may be the result of computations and/or a series of operations carried out during a designing phase of the 3D modeled object representing the mechanical part. The shape of the mechanical part displayed on the screen of the computer when the modeled object is represented is (e.g. a tessellation of) the B-rep. In examples, the B-rep represents a part of the model object.

Figure 4:
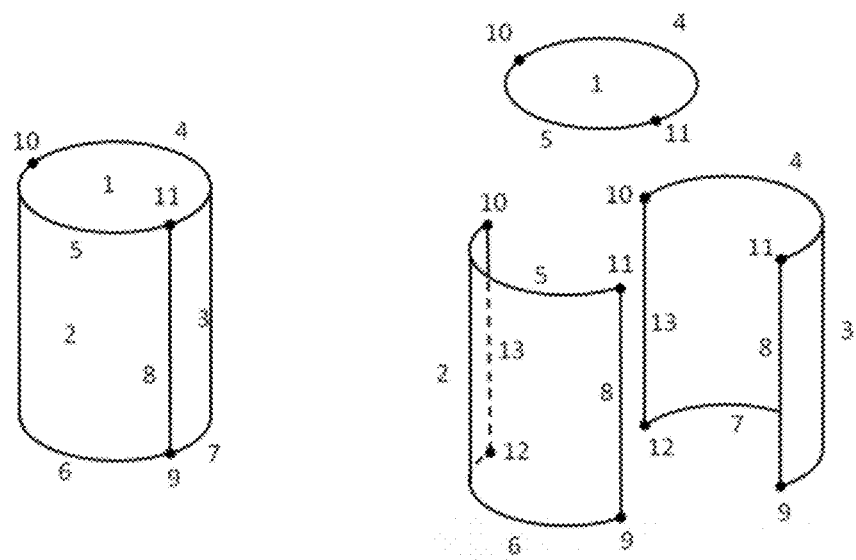
FIGS. 4, 5, 6, 7, 8, 9, 10, 11, 12, 13, 14 and 15 show B-rep concepts involved in the method.
Figure 5:
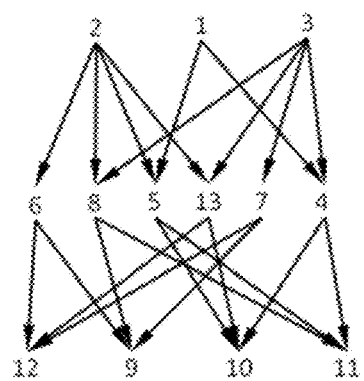
Figure 6:
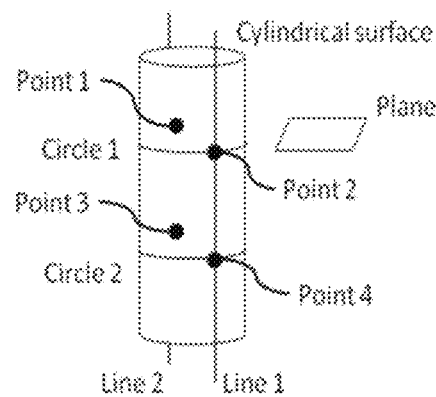

A B-Rep includes topological entities and geometrical entities. Topological entities are: face, edge, and vertex. Geometrical entities are 3D objects: surface, plane, curve, line, point. By definition, a face is a bounded portion of a surface, named the supporting surface. An edge is a bounded portion of a curve, named the supporting curve. A vertex is a point in 3D space. They are related to each other's as follows. The bounded portion of a curve is defined by two points (the vertices) lying on the curve. The bounded portion of a surface is defined by its boundary, this boundary being a set of edges lying on the surface. Edges of the face's boundary are connected by sharing vertices. Faces are connected by sharing edges. Two faces are adjacent if they share an edge. Similarly, two edges are adjacent if they share a vertex. FIG. 4 illustrates a B-rep of a cylindrical slot made of three faces: top planar face and two lateral cylindrical faces. Left drawing is the perspective view of the slot. Visible faces, edges and vertices are numbered. Right drawing is the exploded view of all faces. Duplicated numbers illustrate edges and vertices sharing. Face 1 is a bounded portion of a plane. Boundary of face one includes edges 4 and 5, each of them being bounded by vertices 10 and 11. They both have the same supporting circle. Face 2 is bounded by edges 6, 8, 5 and 13 all lying on an infinite cylindrical surface. Faces 1 and 2 are adjacent because they share edge 5. Faces 2 and 3 are adjacent because they share edges 8 and 13. Faces 1 and 3 are adjacent because they share edge 4. FIG. 5 shows a graph illustrating the "is bounded by" topological relationship of the B-Rep of FIG. 4. Nodes of higher layer are faces, nodes of intermediate layer are edges and nodes of lower layer are vertices. FIG. 6 shows a graph (left drawing) illustrating the relationship between topological entities (faces, edges, vertices) of the B-rep of FIG. 4 and the supporting geometries (right drawing). In the CAD system, the B-Rep gathers in an appropriate data structure the "is bounded by" relationship, the relationship between topological entities and supporting geometries, and mathematical descriptions of supporting geometries.

Figure 7:
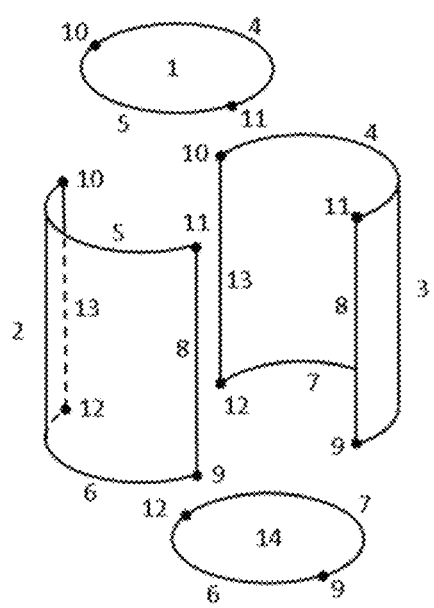
Figure 7:
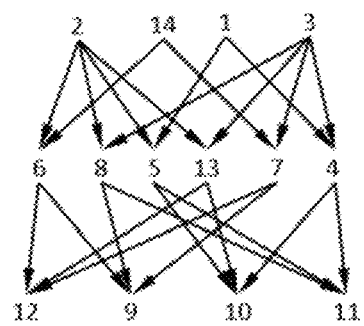

By definition, an internal edge of a B-Rep is shared by exactly two faces. By definition, a boundary edge is not shared, it bounds only one face. By definition, a boundary face is bounded by at least one boundary edge. A B-Rep is said to be closed if all its edges are internal edges. A B-Rep is said to be open is it includes at least one boundary edge. The B-Rep of the example shown in FIG. 4 is open because edges 6 and 7 are boundary edges. Conversely, edges 4, 5, 8 and 13 are internal edges. A closed B-Rep is obtained from the example of FIG. 4 by adding disk-like face 14 bounded by edges 6 and 7 as illustrated in FIG. 7. Left drawing shows the closed B-rep, right drawing shows a graph illustrating the "is bounded by" topological relationship of the closed B-Rep. A closed B-Rep is used to model a thick 3D volume because it defines the inside portion of space (virtually) enclosing material. An open B-Rep is used to model a 3D skin, which represents a 3D object the thickness of which is sufficiently small to be ignored.

Figure 8:
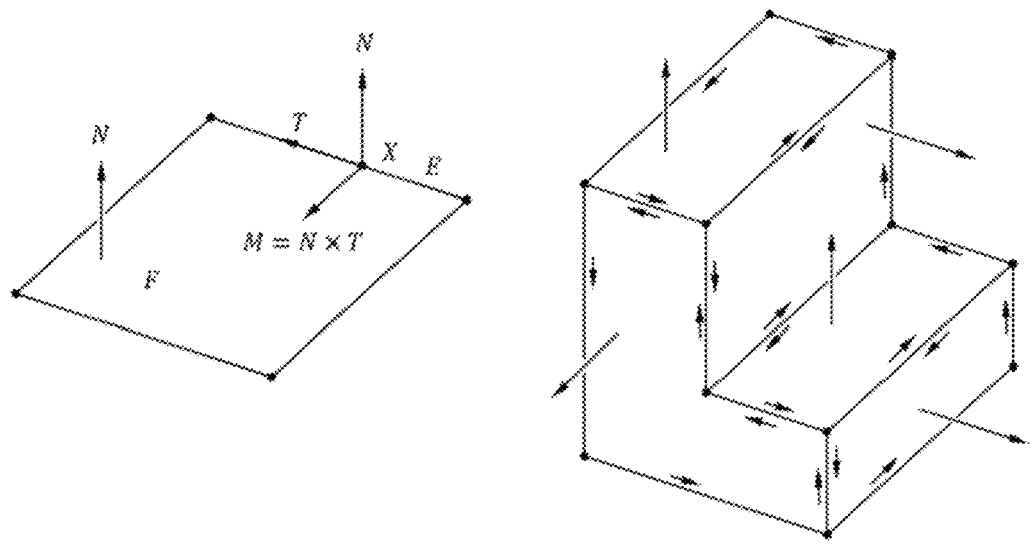

Each face of the B-Rep is equipped with a normal vector, defined with the help of the supporting surface. Firstly, the normal vector is collinear with the normal vector of the supporting surface. In addition, the normal vector of a closed B-Rep representing a mechanical part is directed outside the material. Let F be a face of the B-Rep and N its outer normal vector. Let E be an edge of face F, X a point on edge E and T the normalized tangent vector of edge E at point X. By definition, edge E is oriented counterclockwise if vector M=N×T is directed toward the inside region of the face, as illustrated by left drawing in FIG. 8. Notice that since vectors N and T are normalized and perpendicular, then vector M is normalized. By convention, all edges of all faces of a B-Rep are oriented counterclockwise, as illustrated by right drawing in FIG. 8.

Figure 9:
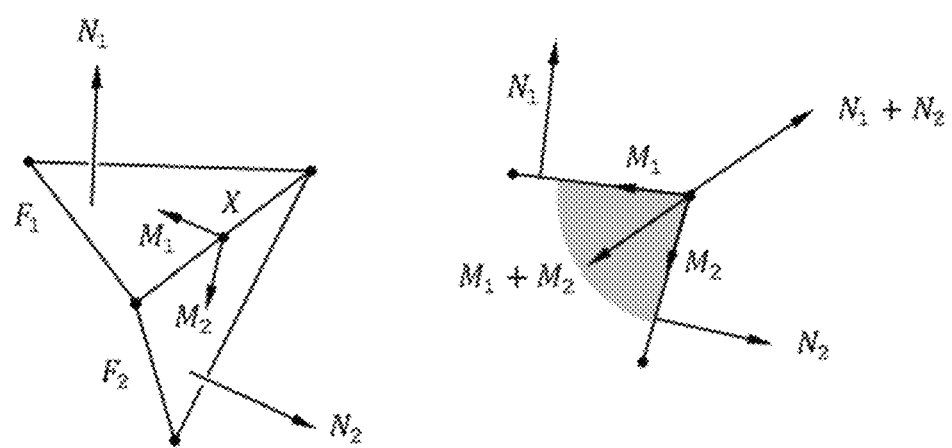
Figure 10:
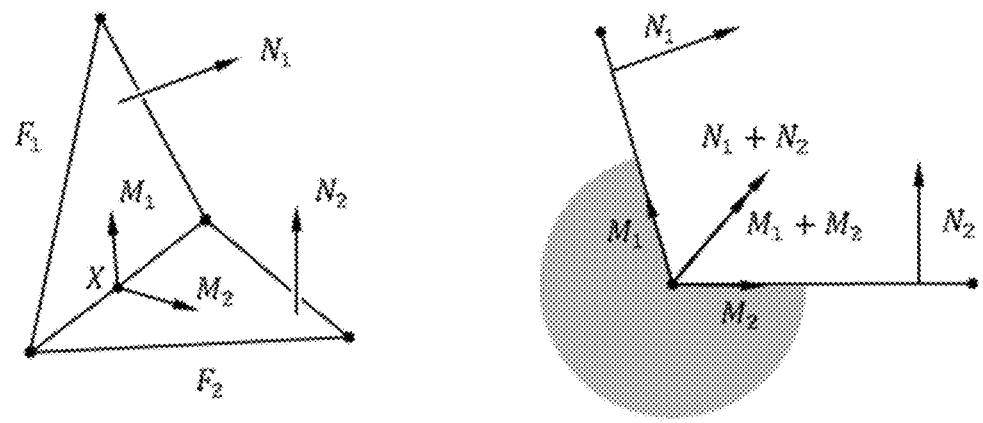
Figure 11:
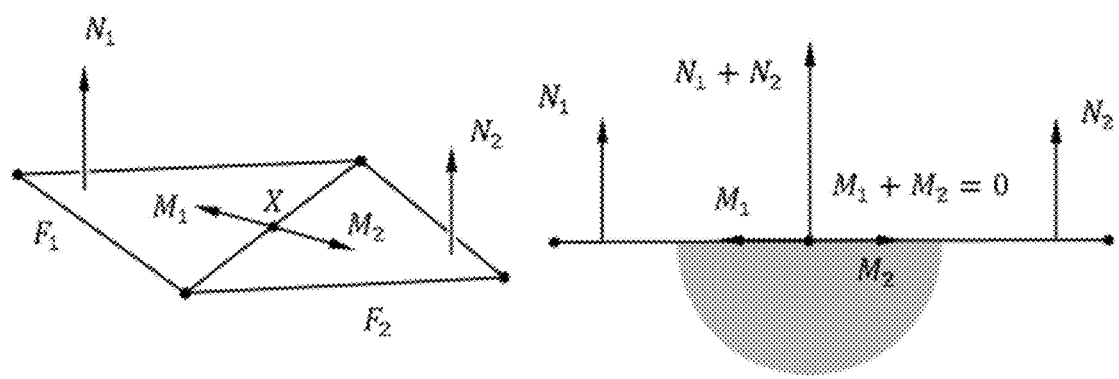
Figure 12:
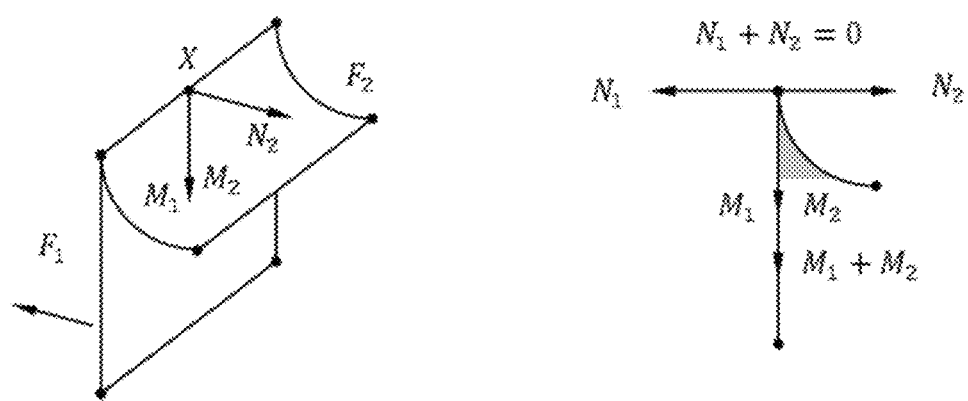

The following discusses the notion of edges convexity. Given the B-Rep of a 3D modeled object, let E be an edge shared by faces $F_1$ and $F_2$, and let X be a point on edge E. Respective outer normal vectors of faces $F_1$ and $F_2$ are noted $N_1$ and $N_2$. Let $P_1$ and $P_2$ be the planes through point X with respective normal vectors $N_1$ and $N_2$. Planes $P_1$ and $P_2$ locally define an outside 3D region and an inside 3D region in the neighborhood of point X. By nature, vector $N_1+N_2$ points to the outside 3D region. Let $M_1$ and $M_2$ be the respective material vectors of point X with respect to faces $F_1$ and $F_2$. By nature, vector $M_1+M_2$ points to the convex 3D region. By definition, edge E is convex at point X if $N_1+N_2$ and $M_1+M_2$ have opposite directions, i.e. if $\langle M_1+M_2, N_1+N_2 \rangle <0$, as illustrated in FIG. 9. Edge E is convex if it is convex at all points. Conversely, edge E is said to be concave at point X if $N_1+N_2$ and $M_1+M_2$ have the same direction, i.e. if $\langle M_1+M_2, N_1+N_2 \rangle >0$, as illustrated in FIG. 10. Edge E is concave if it is concave at all points. Otherwise, $\langle M_1+M_2, N_1+N_2 \rangle =0$ meaning that the edge is either a smooth edge or a knife edge. A smooth edge is such that $M_1+M_2=0$ and $N_1=N_2$ as illustrated in FIG. 11. It usually occurs in B-Rep of typical mechanical parts. A knife edge is such that $N_1+N_2=0$ and $M_1=M_2$ as illustrated in FIG. 12. Knife edge is described for completeness, it is not usually used for modeling mechanical parts.

Figure 13:
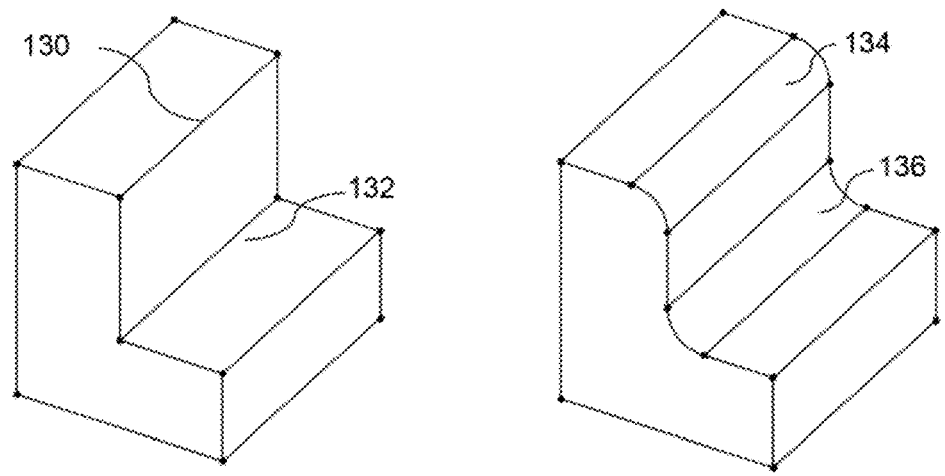
Figure 14:
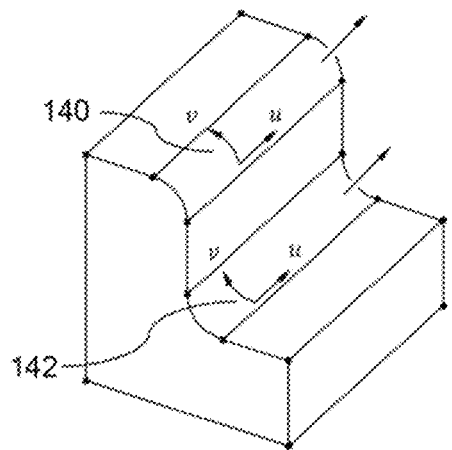

From the geometrical point of view, a round face replaces a convex sharp edge by a smooth transition. The transition face is the envelope of a rolling ball connecting the adjacent faces of the initial sharp edge. Similarly, a fillet face replaces a concave sharp edge by a smooth transition based on the same rolling ball geometry. FIG. 13 illustrates the geometry of round and fillet faces. FIG. 13 shows a convex edge 130, a concave edge 132, a round face 134 and a fillet face 136. Just like canonical surfaces (such as cylinder, plane, sphere, cone) round faces and fillet faces are generally equipped with a logical type in the B-Rep data structure. If this logical type is missing they can be recognized as follows. The parameterization S: $[a,b]\times[c,d] \to \mathbb{R}^3$ with $(u,v) \mapsto S(u,v)$ is such that for all $u \in [a,b]$ the curve $v \mapsto S(u,v)$ is a portion of a circle the radius of which does not depend on u. Or, for all $v \in [c,d]$ the curve $u \mapsto S(u,v)$ is a portion of a circle the radius of which does not depend on v. If the outer normal vector of the B-rep is oriented toward the concave side of the circle, then the face supported by surface S is a round surface. If the outer normal vector of the B-rep is oriented toward the convex side of the circle, then the face supported by surface S is a fillet surface. FIG. 14 illustrates the parameterization of a round face 140 and of a fillet face 142. Round faces and fillet faces respectively behave like convex edges and concave edges. This is because, from the mechanical point of view, a round face is a smooth transition replacing a convex sharp edge, and a fillet face is a smooth transition replacing a concave sharp edge. This always occurs when designing mechanical parts manufactured through molding and machining methods.

Figure 15:
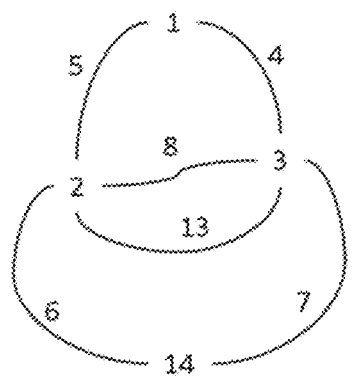

The following discusses the notion of dual graph of the B-rep. The dual graph of the B-Rep is a logical graph that captures faces adjacencies only. It is defined as follows. Nodes of the dual graph are associated with faces of the B-Rep and arcs of the dual graph are associated with edges of the B-Rep. An arc of the dual graph connects two nodes of the dual graph if the B-Rep edge associated with the arc is shared by the B-Rep faces respectively associates with nodes. For example, the dual graph of the cylindrical B-Rep of FIG. 7 is represented in FIG. 15. Arcs are labeled with edges numbers. By definition, a set of faces is connected if the nodes of the dual graph representing the faces of the set are the nodes of a connected subgraph of the dual graph. In other words, a connected set of faces forms an arcwise connected part of the B-rep. A skin is a face or a connected set of faces. A smooth skin is a face or a connected set of faces containing only smooth internal edges.

A feature may be represented by a connected set of faces. In other words, the part of the B-rep corresponding to the connected set of faces may model and/or represents the geometry of the feature. If the feature is a depression feature, the connected set of faces may be bounded by convex edges or round faces. If the feature is a protrusion feature, the connected set of faces may be bounded by concave edges or fillet faces.

The providing S10 of the B-rep may comprise displaying the B-rep on a display of the CAD system. The providing S10 of the B-rep may result from an action of a user, e.g. an interaction between the user and the CAD system of the method. In examples, the 3D modeled object (e.g. partly) represented by the B-rep may have been designed by another user on another CAD system and optionally stored in a memory and/or sent (e.g. through a network) to the CAD system of the method. The providing S10 of the B-rep may comprise retrieving the B-rep from a memory. In examples, the user and the other user are different, and the CAD system of the method and the other CAD system are different. In these examples, the CAD system of the method and the other CAD system may be connected by a network. In examples, the user and the other user are the same, and the CAD system of the method and the another CAD system are the same.

The providing S20 of the feature type is now discussed.

Providing S20 a feature type comprises specifying that the feature type is the protrusion feature type or that the feature type is the depression feature type. The provided feature type forms data which is an input of the recognizing S30 of the second set of faces, e.g. an input of one or more algorithm involved in the recognizing S30 of the second set of faces.

The providing S20 of the feature type may be carried out upon user action. Examples where the providing S20 of the feature type is carried out upon user action are now discussed.

In examples, specifying the feature type may comprise choosing, upon user action, the feature type among the protrusion feature type and the depression feature type, e.g. by interacting with a software (e.g. of the CAD system) offering a choice among the two types of feature. Alternatively, the user may specify that the feature type is the protrusion feature type or that the feature type is the depression feature type by declaring the feature type, e.g. by interaction (e.g. using a keyboard or a haptic device or a touch) with the CAD system. In these examples, the recognizing S30 of the second set is adapted to receive as input a feature type among any one of the depression feature type and the protrusion feature type. In these examples, the recognizing S30 may comprise a determination (e.g. a recognition) of the feature type received as input. In examples, there may be one or more first algorithms involved in the recognizing S30 in case the provided feature type is the depression feature type, and one or more second algorithms involved in the recognizing S30 in case the provided feature type is the protrusion feature type. In these examples, the determination of the feature type received as input triggers the application of either the one or more first algorithm or the one or more second algorithm. Alternatively or additionally, the one or more first algorithm and the one or more second algorithm may be identical but dependent of one or more parameters. In this case, the determination of the feature type received as input specifies (e.g. instantiates) the one or more parameters so that a second set of faces representing a feature of the received feature type is searched and recognized.

In examples, the user may be offered a single feature type to specify, and the user specifies (e.g. selects, e.g. declares) it, e.g. by interacting (e.g. with a keyboard or a haptic device or a touch) with (e.g. a graphical user interface of) the CAD system. In other words, only the protrusion feature type may be selected (e.g. specified, e.g. declared) by the user, or only the depression feature type may be selected (e.g. specified, e.g. declared) by the user. In these examples, the recognizing S30 of the second set is adapted to receive as input only said single feature type.

Alternatively, the providing S20 of the feature type may be automatically carried out by the CAD system.

The providing S20 of the first set of faces is now discussed.

The first set of faces encompasses (e.g. comprises, e.g. includes, e.g. contains) faces representing the feature of the provided feature type. In other words, at least all faces involving the protrusion (resp. depression) of interest (i.e. the one which ought to be recognized by the method) are part of the provided first set. The first set may encompass additional faces which are not part of the faces representing the feature of the provided feature type. In examples, the set made of all faces of the B-rep comprises a strict subset of faces. The strict subset of faces comprises the faces representing the feature of the provided feature type and one or more other faces. In these examples, the first set of faces is a subset of the strict subset, the subset of the strict subset containing at least all faces representing the feature of the provided feature type. In examples, the subset of the strict subset contains one or more of the one or more other faces. In examples, the set of faces made of the one or more other faces does not include any set of faces representing another feature of the provided feature type. The first set of faces may be called a super set or a super set of faces.

The providing S20 of the first set of faces may comprise selecting (e.g. simultaneously) the faces of the first set of faces among the faces of the provided B-rep. The provided first set of faces forms data which is an input of the recognizing S30 of the second set of faces, e.g. an input of one or more algorithm involved in the recognizing S30 of the second set of faces. The providing S20 of the first set of faces may preceded by a displaying of the B-rep on a display of the CAD system.

The providing S20 of the first set of faces may be performed by a user. For example, the user may directly select the first set of faces and no other face, for example by (e.g. graphical) interaction with the CAD system. Selecting the first set of faces by graphical interaction with the CAD system may comprise drawing a shape (e.g. a closed curve) on the B-rep displayed on the display of the CAD system, so that the shape encompasses the first set of faces. In examples, the drawing of the shape may be carried out by using a haptic device such as a mouse. The user may begin (e.g. initiate) the drawing by clicking with a haptic device on a location of the screen. A cursor may be displayed on the location as a result of the clicking. Then the user may carry out the drawing by dragging the cursor on the screen, the trajectory of the cursor forming the shape. Alternatively, the drawing of the shape may be performed by a continuous touch of the user, the continuous touch forming the shape.

Alternatively or additionally, the providing S20 of the first set of faces may be performed semi-automatically, i.e. the providing S20 of the first set of faces may involve one or more user actions and one or more actions executed automatically by a computer. The user may for example select an initial set of faces by (e.g. graphical) interaction with the CAD system. The providing S20 of the first set may comprise an automatic processing of the selected initial set of faces. The processing may comprise adding faces to the initial set of faces and/or discarding (e.g. removing) faces from the initial set of faces. In these examples, the processing takes as input the selected initial set of faces and outputs the first set of faces. Selecting the initial set of faces by graphical interaction with the CAD system may comprise drawing a shape (e.g. a closed curve) on the B-rep displayed on the a display of the CAD system, so that the shape encompasses the initial set of faces. In examples, the drawing of the shape may be carried out by using a haptic device such as a mouse. The user may begin (e.g. initiate) the drawing by clicking with a haptic device on a location of the screen. A cursor may be displayed on the location as a result of the clicking. Then the user may carry out the drawing by dragging the cursor on the screen, the trajectory of the cursor forming the shape. Alternatively, the drawing of the shape may be performed by a continuous touch of the user, the continuous touch forming the shape. In examples, the drawing of the shape results in that several disjoints connected sets of faces are encompassed in the shape, only one of these sets having one or more face that is at least partially visible. A face is at least partially visible if there is at least a part of the face that is not hidden on the display by any other face of the B-rep. The first set of faces is the only one set having one or more partially visible face. In other words, faces of the other sets are discarded during the processing.

The first set of faces may be provided after the feature type. In such an example, the first set of faces encompasses the faces representing a feature of the already provided feature type. Alternatively, the first set of faces may be provided before the feature type. In such an example, the first set of faces encompasses faces representing a depression feature (resp. a protrusion feature). The feature type which is later provided is then of the depression feature type (resp. of the protrusion feature type).

Examples of the providing S20 of the first set of faces are now discussed.

In examples, providing S20 the first set of faces comprises displaying the B-rep on a display of the CAD system and selecting the first set of faces by graphical user-interaction. The graphical user-interaction may be a drawing of a shape as discussed above. The user may thus select all faces of the first set at once by a simple graphical interaction. This is an ergonomic improvement, for example compared to a multi-selection of faces using the shift key of a keyboard, where faces are selected one by one and each time a face is selected, the face is saved by pressing and releasing the shift key of a keyboard, which implies numerous user-machine interactions.

In examples, the selecting of the first set of faces comprises by graphical user-interaction, defining a closed curve on the display. In these examples, the selecting of the first set of faces further comprises, automatically by the CAD system, identifying each face of the B-rep of which projection on the display is entirely included inside the closed curve.

Defining the closed curve is a particularly simple and ergonomic manner for the user to carry out the selecting of the first set of faces. The closed curve defined by the user may encompass faces that the user does not want to select, i.e. the faces which are not entirely projected inside the closed curve. Instead of requiring the user to carry out a difficult and accurate defining of the closed curve that would avoid such unwanted faces, the method rather eliminates them by only identifying the faces which are entirely projected inside the closed curve. The selecting of the first set of faces is thus efficient and constitutes an improved user-machine interaction.

Defining the closed curve may comprise drawing the closed curve on the display. The closed curve encompasses the first set of faces and may encompass additional faces. The closed curve may be displayed as a continuous line or as a dotted line on the display. The domain bounded (e.g. encircled) by the closed curve may in examples be a planar simply connected domain on the display, i.e. the closed curve forms the boundary of the domain. The domain may be (e.g. substantially) a rectangle, a circle, a square, an ellipse or a triangle. Drawing the closed curve may comprise a first user interaction on a first location with the display, e.g. by a click (e.g. with a haptic device such as a mouse) or by a touch (e.g. with a finger of the user). The first user interaction may be maintained. Drawing the closed curve may then comprise performing a drag and/or slide and/or translation on the display from the first location to a second location of the display. Performing the drag and/or slide and/or translation may consist in dragging and/or sliding and/or translating the cursor of a haptic device or a finger of the user from the first location to the second location, e.g. while following (e.g. substantially) the diagonal of a rectangle or a square or the diameter of a circle or the median of a triangle or an axis of an ellipse or any closed path which starts and ends at the first location (in which case the first and second location are identical). The first user interaction may be maintained throughout the drawing of the closed curve and released to end the drawing and fix the curve.

The projection of a face on the display may be the orthogonal projection of the face on the domain bounded (e.g. encircled) by the closed curve. Each projection of each face may thus be computed automatically by the CAD system, e.g. according to one or more stored and known mathematical formulae. The closed curve encompasses a set of faces if and only if each projection of each face of the set is entirely included inside the closed curve, e.g. is entirely included in the domain bounded (e.g. encircled) by the closed curve. In examples, the closed curve encompasses the first set of faces.

In examples, the selecting further comprises, automatically by the CAD system, partitioning the identified faces into disjoint connected subsets of faces. One and only one subset is the first set of faces. In these examples, the selecting further comprises, automatically by the CAD system, discarding all other subsets.

As a result, independently of the accuracy of the user's definition of the closed curve, the method automatically retains the first set of faces among all faces encompassed by the user's closed curve. In other words, the user does not need to define an accurate and complicated closed curve that would encompass exactly the first set of faces. The user instead just needs to define a simple closed curve which encompasses at least (e.g. roughly) the first set of faces, and the system automatically retains and outputs the first set of faces. The method is thus very ergonomic.

In examples, the CAD system automatically visits all identified faces and detects all maximal connected subsets of faces. In these examples, a connected subset of faces of the set of all the identified faces is maximal if adding one identified face to the connected subset forms a non-connected set of faces. In other words, as the identified faces correspond to nodes of a subgraph of the dual graph of the B-rep, each maximal connected subsets of faces correspond to nodes of a respective maximal connected component of the subgraph. The maximal connected subsets of faces form, by theory, a partition of the set of all identified faces and are, by theory, disjoint.

In examples, a face is visible if there is no other face between the face and the interior of the closed curve. A face is partially visible if only a part of the face is visible. In these examples, the one and only one subset is the only subset of faces resulting from the partitioning that contains at least one (e.g. partially) visible face. All other subsets are discarded because they include only non-visible faces.

Discarding all other subsets implies that at the end of the selecting, only the first set of faces remains and is provided S20.

An implementation of the providing S20 of the first set of faces is now discussed with reference to FIG. 29. The providing S20 of the first set of faces is performed by using a graphical trap and a trap algorithm.

The graphical trap selection is for the user to draw a rectangle on the display of the CAD system (e.g. through two mouse clicks, e.g. one at each extremity of a diagonal of the rectangle). The rectangle edges are respectively horizontal and vertical. On one hand, the roughness of this shape makes its locating and sizing very easy from the user point of view. On the other hand, even if the user defines a rectangle that is as small as possible to include the set of faces of interest, some unwanted faces may fall inside the rectangle anyway. The trap algorithm is applied to discard said unwanted faces. Given a B-rep and a user-defined graphical trap, the trap algorithm selects the set of relevant faces through three steps. The first step is to identify all faces of the B-rep that are included in the trap, whether they are visible or not. By definition, a face is included in the trap if its projection on the display is included in the rectangle defining the trap. These faces are called the trapped faces. The second step is to compute adjacency relationships within the trapped faces. This yields a partition of trapped faces into disjoint connected subsets of adjacent faces. All subsets including only non-visible faces are discarded. It remains only one subset that contains at least one visible face, and this subset is the provided S20 first set of faces.

Figure 29:
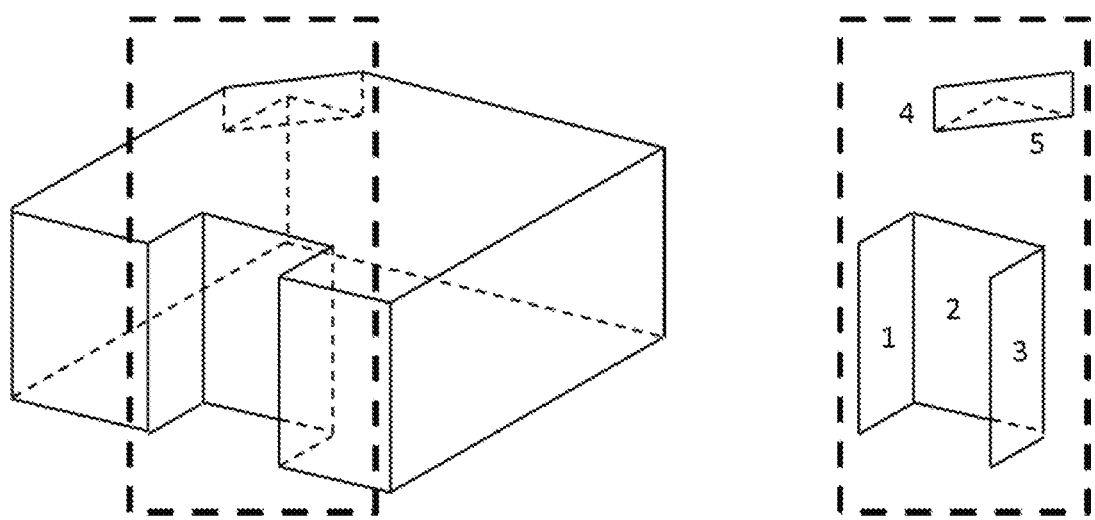

Consider for example the B-rep in left drawing of FIG. 29 together with the graphical trap (dotted rectangle). This user selection defines trapped faces {1,2,3,4,5} according to the first step of the algorithm. Notice that faces 3, 4 and 5 and not visible on the B-rep. According to second step, adjacency computation yields a first subset {1,2,3} and a second subset {4,5}. According to third step, subset {4,5} is discarded because it includes only non-visible faces and subset {1,2,3} is kept because it includes at least one (partially) visible face. So, the provided S20 first set of faces is {1,2,3}. Notice that the algorithm is able to select face 3 despite it is non-visible. Face 3 is relevant because is defines the front notch.

The recognizing S30 of the second set of faces is now discussed.

The recognizing S30 is carried out automatically by the CAD system. In other words, upon the providing S20 of the first set of faces and of the feature type and their reception as inputs of the recognizing S30, the recognizing automatically recognizes the second set of faces, e.g. throughout the execution (e.g. by one or more processors of one or more algorithms taking as inputs the first set of faces and of the feature type. In these examples, upon reception of said inputs by said one or more algorithms, the CAD system automatically executes and/or runs said one or more algorithms, said execution and/or running resulting in the recognition (e.g. the detection or the determination) of the second set of faces. The recognizing S30 may comprise the execution of any set of one or more algorithms that are adapted to recognize faces representing a feature of the provided feature type among the first set of faces.

The method recognizes the faces representing the feature of the provided feature type in a very efficient and ergonomic manner. Notably, it is provided a first set of faces which encompasses all faces representing the feature. Thus, instead of selecting one face among the faces representing the feature of the provided feature type and attempting to identify (e.g. iteratively) the other faces representing the feature of the provided feature type, which could result in missing one or more of said other faces, the method starts from a larger set of faces (the provided first set of faces). The method then recognizes a subset (the second set of faces) within this larger set of faces and this subset is made of the faces representing the feature of the provided feature type. None of these faces is missing. Furthermore, the recognition of the faces representing the feature of the provided feature type is carried out automatically and as a result of the providing S20 of a larger set which may be carried out in a very ergonomic manner by a user. The method is thus very ergonomic and efficient.

In examples, the recognizing S30 outputs the second set of faces. In examples, all faces of the set of faces are combined to form data corresponding to the second set of faces. In examples, as a result of the recognizing S30, there is a pointer that points to a memory space where all data relative to all faces of the second set of faces is stored. In examples, the method comprises storing data relative to the second set of faces and/or sending it to another CAD system, e.g. through a network.

In examples, the recognized second set of faces may be processed. Processing the second set of faces may comprise one or more of the following:
  extracting the second set of faces from the B-rep and/or displaying it, e.g. in a separated window of a display of the CAD system and/or highlighting it within a display of the B-rep;
  applying one or more design and/or edition operation (e.g., change dimensions, change size, translate, change thickness, rotate, cut, copy, copy and/or paste) automatically and in a unified way to all faces of the second set of faces; and/or
  applying one or more design and/or edition operation (e.g. translate, change size, change dimensions, round, fillet, draft angle and/or change thickness) automatically and in a unified way to all edges of one type (e.g. the sharp type, the smooth type, the knife type, the convex type or the concave type) bounding faces of the second set of faces.

Applying an operation automatically and in a unified way to a set of faces and/or edges consists in: specifying (e.g. selecting, e.g. upon user action) the set and the operation, launching (e.g. by interacting with the CAD system, e.g. upon user action) the operation, and, automatically (e.g. by the CAD system), applying the operation to all objects of the set (e.g. substantially) identically and/or (e.g. substantially) simultaneously. Rounding and/or filleting sharp edges of the B-rep may correspond to smooth the geometry of the detected feature. This renders the geometry detected feature adapted for an easy application of a manufacturing tool in a manufacturing process manufacturing the mechanical part, such as a milling tool in a machining process, a molding matrix in a molding process, a rotary cutting tool in a drilling process, a non-rotary cutting tool in a turning process, a hammer or a die in a forging process, a stamping press in a stamping process and/or a press brake or a folder or a panel bender in a folding process.

In examples, the second set of faces forms a connection between one or more elementary subsets. In these examples, if the provided feature type is the depression feature type, an elementary subset is (e.g. defined as):
- a connected set of one or more faces bounded by convex edges or round faces only and containing no convex internal edge and no round face, and
- either not a smooth skin or a smooth skin satisfying a concavity criterion.

Additionally or alternatively, if the provided feature type is the protrusion feature type, an elementary subset is (e.g. defined as):
- a connected set of one or more faces bounded by concave edges or fillet faces only and containing no concave internal edge and no fillet face, and
- either not a smooth skin or a smooth skin satisfying a convexity criterion.

In examples, the one or more elementary subsets comprise two or more elementary subsets.

The method is particularly efficient in that the method allows recognition of several elementary subsets within a larger set of faces (i.e. the first set of faces). On the contrary, a method that would start from an initial face which is part of an elementary subset and that would attempt to iteratively visit adjacent faces of the initial face so as to identify the elementary subset could be blocked when crossing a convex edge or a round face (in the case of depression recognition) or a concave edge or a round edge (in the case of protrusion recognition). Such a method would thus recognize one elementary subset at best. Recognizing further elementary subsets would require starting over form other initial faces and revisiting adjacent faces, which lacks efficiency. The method is however very efficient, because internal convex (resp. concave) edges or round (resp. fillet) faces do not block the recognizing of several elementary subsets. Furthermore, selecting several initial starting faces is less ergonomic that the providing S20 of the first set of faces according to the method. Moreover, the method allows for recognizing a connection between elementary subsets.

If the provided feature type is the depression feature type, an elementary subset may be referred to as an "elementary depression" or as "representing an elementary depression". Additionally or alternatively, if the provided feature type is the protrusion feature type, an elementary subset may be referred to as an "elementary protrusion" or as "representing an elementary protrusion".

The convexity criterion and the concavity criterion are now discussed.

In examples, a smooth skin bounded by convex (resp. concave) edges or round (resp. fillet) faces only and containing no convex (resp. concave) internal edge and no round (resp. fillet) face respects the concavity (resp. convexity) criterion if the smooth skin is concave (resp. convex) relatively to an inward orientation of the B-rep. In examples, the smooth skin is concave (resp. convex) relatively to an inward orientation of the B-rep if the smooth skin is one fillet (resp. round) face or if the face obtained by suppressing all internal edges of the smooth skin and merging all the faces of the smooth skin is a fillet (resp. round) face.

In examples, a smooth skin bounded by convex edges or round faces only and containing no convex internal edge and no round face satisfies the concavity criterion if the smooth skin cannot be arbitrarily offset in the direction of its normal vector while remaining smooth. Alternatively or additionally, a smooth skin bounded by concave edges or fillet faces only and containing no concave internal edge and no fillet face satisfies the convexity criterion if the smooth skin cannot be arbitrarily offset in the opposite direction of its normal vector while remaining smooth.

In other words, in examples, a smooth skin bounded by convex edges or round faces only and containing no convex internal edge and no round face satisfies the concavity criterion if there exists an offset of the smooth skin in the direction of its normal vector such that the offset is not smooth. Alternatively or additionally, a smooth skin bounded by concave edges or fillet faces only and containing no concave internal edge and no fillet face satisfies the convexity criterion if there exists an offset of the smooth skin in the opposite direction of its normal vector such that the offset is not smooth.

The method thus allows for the recognition of elementary depressions (resp. depressions) which are smooth skins.

Figure 22:
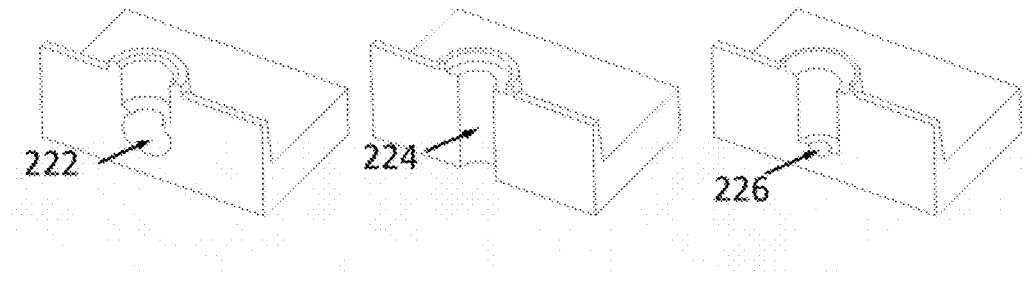

FIG. 22 shows three examples of B-reps comprising three respective smooth skins 222, 224 and 226, each bounded by convex edges or round faces only and containing no convex internal edge and no round face. Each smooth skin 222, 224, 226 respects the concavity criterion, such that each smooth skin 222, 224, 226 is an elementary subset when the provided feature type is the depression feature type, in other words an elementary depression.

Examples of the convexity criterion and of the concavity criterion are now discussed.

In these examples, a smooth skin forms a smooth parametrized surface. A parametrized surface is a mapping $S:[a,b] \times [c,d] \to \mathbb{R}^3$ with $(u,v) \mapsto S(u,v)$. When the cross product of partial derivatives $S_u(u,v) \times S_v(u,v)$ does not vanish, the normal vector $N(u,v)$ is defined by the normalized cross product.

$$N(u,v) = \frac{S_u(u,v) \times S_v(u,v)}{\|S_u(u,v) \times S_v(u,v)\|}.$$

A self-intersection point of surface S is a pair $(u_1,v_1)$, $(u_2,v_2)$ of parameter values such that $(u_1,v_1) \neq (u_2,v_2)$ and $S(u_1,v_1)=S(u_2,v_2)$. By definition, a surface is regular (e.g. smooth) if its normal vector is well defined for all $(u,v) \in [a,b] \times [c,d]$ and if it does not feature any self-intersection point in $[a,b] \times [c,d]$. Given a regular surface S and real number $\delta \geq 0$, the offset surface P at distance $\delta$ from surface S is defined by $P(u,v)=S(u,v)+\delta N(u,v)$. Clearly, $P(u,v)=S(u,v)$ if $\delta=0$. Let $K^+(S)$ be the set of numbers $\delta \geq 0$ such that the offset surface $P=S+\delta N$ is a regular surface. Set $K^+(S)$ is non empty because it includes $\delta=0$. Let $\delta^+$ be the supremum of $K^+(S)$, noted $\delta^+=\sup K^+(S)$. This means that for any $\delta < \delta^+$, the offset surface $P=S+\delta N$ is a regular surface. By convention, if $P=S+\delta N$ is a regular surface for $\delta \geq 0$, then $\delta^+$ is infinite, which is noted $\delta^+=+\infty$. The offset surface is defined as well on the opposite side of its normal vector by considering $\delta \geq 0$ and $-N(u,v)$, i.e. is $Q(u,v)=S(u,v)-\delta N(u,v)-\delta N(u,v)$. Set $K^-(S)$ be the set of numbers $\delta \geq 0$ such that the offset surface $Q=S-\delta N$ is a regular surface and $\delta^-=\sup K^-(S)$ be the supremum of $K^-(S)$ with the same infinite convention. In these examples, a smooth skin bounded by convex edges or round faces only and containing no convex internal edge and no round face satisfies the concavity criterion if the smooth skin is a regular surface S for which $\delta^+ \neq +\infty$. In these examples, a smooth skin bounded by concave edges or fillet faces only and containing no concave internal edge and no fillet face satisfies the convexity criterion if the smooth skin is a regular surface S for which $\delta^- \neq +\infty$.

Figure 23:
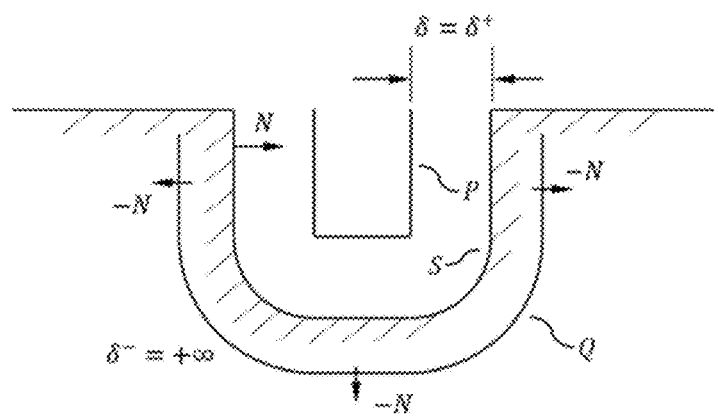
Figure 24:
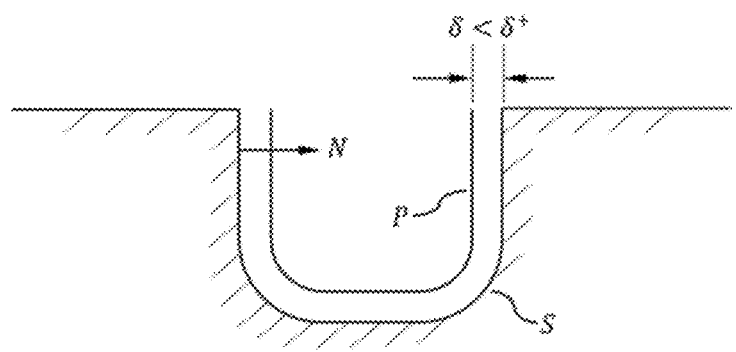
Figure 25:
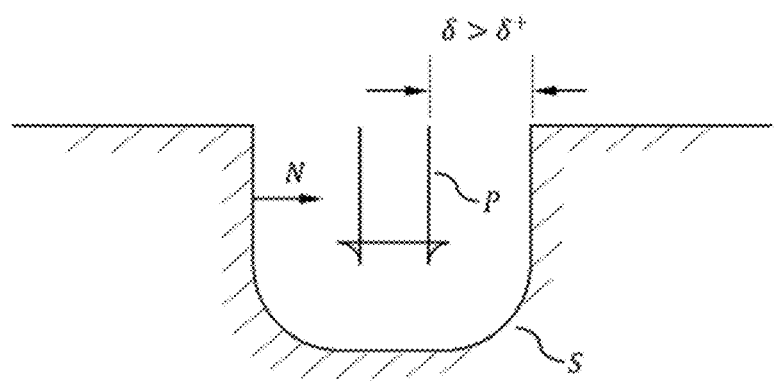

FIG. 23 illustrates a U-shape smooth skin representing an elementary depression and made of two vertical wall faces, two fillet corner faces, and a horizontal bottom face. $\delta^+$ is thus the common radius of the corner fillets. $\delta^- = +\infty$, because the U-shape can be arbitrarily offset in direction $-N$. In FIG. 24, a $\delta^+$ offset has been performed. Offsetting the U-shape skin with $0<\delta<\delta^+$ yields another U-shape skin that is regular, as shown in FIG. 24. Offsetting the U-shape skin with $\delta \geq \delta^+$ yields a singular skin featuring self-intersection points and sharp edges, as shown in FIG. 25. From the implementation point of view, $\delta^+$ and $\delta^-$ are computed by using a sampling of surface S and by computing normal curvature radius. This is well known from classical differential geometry (see for example M. P. do Carmo, *Differential Geometry of Curves and Surfaces*, Prentice Hall, 1976).

The notion of connection is now discussed.

In examples, a connection between one or more elementary subsets is a connected set of faces comprising the one or more elementary subsets. In examples, the set of all faces of the one or more elementary subsets is a disconnected set of faces. In these examples, a connection between the one or more elementary subsets is a connected set of faces comprising the one or more elementary subsets and one or more additional faces connecting the one or more elementary subsets, i.e. one or more additional faces added to the set of all faces of the one or more elementary subsets to render it connected. In examples, each face of the one or more additional faces does not belong to any candidate elementary subset. In examples, the set of all faces of the one or more elementary subsets is a connected set of faces.

In examples, an interface between two sets of faces consists in one or more edges shared by the two sets and/or a set of one or more faces, the set of one or more faces being adjacent to each of the two sets. Two sets are connected when they share an interface, i.e. when there exists an interface between the two sets. In these examples, the second set of faces forms a connection between two or more elementary subsets when, for each elementary subset, there exists at least one interface between the elementary subset and another elementary subset. In other words, the elementary subset is connected at least to the another elementary subset. Faces of said at least one interface, if any, are then comprised in the second set of faces. All faces of all elementary subsets are also comprised in the second set of faces. In examples, the one or more elementary subsets consist in exactly one elementary subset, and the second set of faces simply consists in said one elementary subset.

In examples, the second set of faces comprises all elementary subsets of the first set.

In these examples, all elementary subsets within the first set are thus identified and/or found during the recognizing S30. For example, let $S^1$ be the first set of faces and $S^2$ the second set of faces. Then the set $S^1 \setminus S^2$ contains no elementary subset. The methods thus identifies (e.g. detects, e.g. recognizes) all elementary subsets, and is thus very efficient. In examples, the set (e.g. the list) of the elementary subsets within the first set of faces is unique. In other words, in these examples, faces of the elementary subsets cannot be sorted in such a way that they would form a different set (e.g. list) of elementary subsets.

In examples, each elementary subset is connected to at least one other elementary subset. In these examples two elementary subsets are connected if they share either only edges of a predetermined edge type or only faces of a predetermined face type. If the provided feature type is the depression feature type, the predetermined edge type is the convex edge type and the predetermined face type is the round face type. If the provided feature type is the protrusion feature type, the predetermined edge type is the concave edge type and the predetermined face type is the fillet face type.

Figure 21:
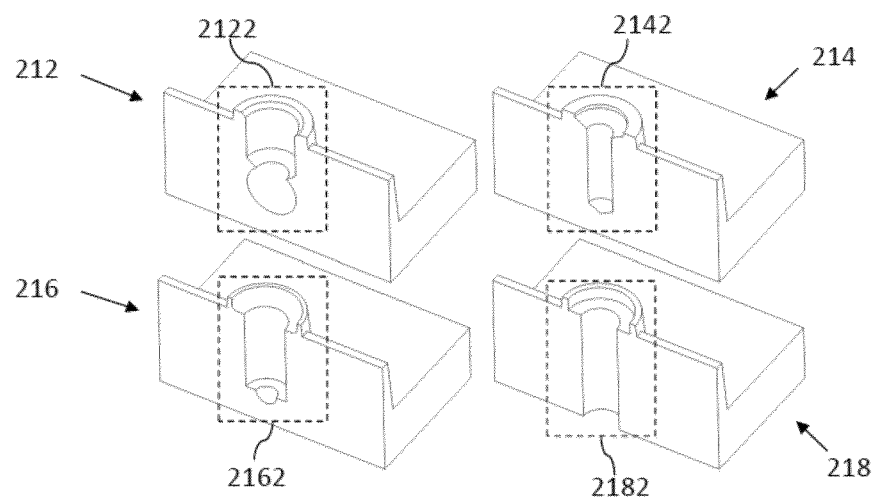
FIGS. 21, 22, 23, 24, 25, 26, 27, 28 and 29 illustrate the method.

The method allows thus to recognize faces representing a depression feature (resp. a protrusion feature) and forming a connection between elementary subsets even if the connection comprises internal convex (resp. concave) edges or round (resp. fillet) faces. The method is thus very efficient in that the recognizing S30 is not blocked (e.g. stopped) by internal edges or faces. In examples, a connection between elementary subsets comprising internal convex (resp. concave) edges or round (resp. fillet) faces is represents a complex depression (resp. protrusion). FIG. 21 shows four examples of B-rep 212, 214, 216 and 218, each B-rep presenting a set of faces representing a complex depression. Said sets of faces are respectively shown encompassed in the dotted rectangles 2122, 2142, 2162 and 2182, for the sake of clarity. The method allows recognition of complex depressions (resp. protrusions). For examples, complex depressions such as the ones represented in the B-reps 212, 214, 216, 218 may be detected by the method.

In examples, the edge type and/or the face type are predetermined in that they may be one or more parameters of one or more algorithm involved in the recognizing S30, in these examples, these one or more parameters may be specified (e.g. set) as a result of the providing S20 of the feature type. For example, the providing S20 of the feature type may automatically trigger the specification of the edge type and/or the face type for detection of a feature of the provided feature type. Additionally or alternatively, predetermined edge types and/or face types may be specifically included in one or more algorithms involved in the recognizing S30 of a protrusion (resp. depression feature) in specific.

In examples, an elementary subset represents an elementary feature of the provided feature type, i.e. an elementary protrusion or an elementary depression. In these examples, an elementary feature is either a feature by itself, i.e. a layout of material performing a mechanical function, or a part of a feature, i.e. a sub-layout of (e.g. a part of) the layout of material that is the feature. In these examples, a feature made of two or more elementary features is a complex feature of the provided feature type (so, a complex depression or a complex protrusion).

As previously discussed, a feature may have a geometry that is a combination one or more basic geometries. In examples, the layout of material that forms an elementary feature corresponds to and/or is represented by and/or is formed by one basic geometry. In examples, the geometry of a complex feature made of two or more elementary features is obtained by combining basic geometries of the two or more elementary features.

In examples where the second set of faces consists in exactly one elementary subset, the feature represented by faces of said elementary subset may be an elementary feature. In other words, said elementary subset may correspond to a part of the B-rep that models and/or represents the basic geometry of the elementary feature.

In examples where the second set of faces forms a connection between two or more elementary features, the feature represented by the second set of faces may be a complex feature made of two or more elementary features each represented by one of the two or more elementary subsets. Each elementary subset may correspond to a part of the B-rep that models and/or represents the basic geometry of the elementary feature represented by the elementary subset. The connection formed by the second set of faces may represent the combination of the basic geometries of the two or more elementary features that makes the geometry of the complex feature.

In examples, a complex feature may be made of several sets or groups of elementary features, each set being either made of an elementary feature or made of a connection between elementary features, the sets being disconnected from one another (i.e. the complex feature does not correspond to a connection between the sets or between some of them). In such examples, the method thus allows to recognize each second set of faces forming a respective one of the sets of elementary features. Thus, iterating the method allows recognition of the complex feature made of the several sets.

The method thus allows for the recognition of both elementary features) and complex features. In particular, complex depressions (resp. protrusions) featuring internal convex (resp. concave) edges and/or round (resp. fillet) faces are detected by the method.

Examples of the recognizing S30 are now discussed.

In examples, the recognizing S30 comprises determining S310 one or more candidate elementary subsets. If the provided feature type is the depression feature type, a candidate elementary subset is (e.g. defined as) a connected set of one or more faces bounded by convex edges or round faces only and containing no convex internal edge and no round face. Alternatively or additionally, if the provided feature type is the protrusion feature type, a candidate elementary subset is (e.g. defined as) a connected set of one or more faces bounded by concave edges or fillet faces only and containing no concave internal edge and no fillet face. The determining S310 of the one or more candidate elementary subsets partitions the first set of faces into faces which each belong to exactly one candidate elementary subset and faces which belong to no candidate elementary subset. In these examples, the recognizing S30 further comprises identifying S320 the one or more elementary subsets among the determined candidate elementary subsets.

Determining S310 one or more candidate elementary subsets comprises searching, within the first set of faces, all subsets of faces which each verify the definition of a candidate elementary subset (it is reminded that said definition depends on the provided feature type, as written above). Determining S310 the one or more candidate elementary subsets may also comprise outputting data corresponding to said subsets of faces and/or providing respective pointers each pointing to a respective memory space where data corresponding to a respective one of said subsets of faces is stored. The determining S310 of one or more candidate elementary subsets partitions the first set of faces in that, as a result of the determining S310 of one or more candidate elementary subsets, each face of the set of faces either belongs to exactly one candidate elementary subset or belongs to no candidate elementary subset. In examples, such a partition of the first set of faces is unique.

A candidate elementary subset is a connected set of one or more faces that partly verifies the definition of an elementary subset (again, said definition depends on the provided feature type, as written above). In specific, if the provided feature type is the depression feature type (resp. the protrusion feature type), an elementary subset is a candidate elementary subset that additionally is a non-smooth skin, or a smooth skin which satisfies the concavity (resp. convexity) criterion. In other words, the set of all candidate elementary subsets contains the set of all elementary subsets. In examples, the set of all candidate elementary subsets strictly contains the set of all elementary subsets, which implies that the two sets are no equal.

Identifying S320 the one or more elementary subsets among the determining candidate elementary subsets comprises, for each candidate elementary subset, if the provided feature type is the depression feature type (resp. protrusion feature type), keeping the candidate elementary subset if it is a non-smooth skin or a smooth skin that satisfies the concavity criterion (resp. convexity criterion), and discarding it if it is a smooth skin which does not satisfy the concavity (resp. convexity) criterion. In examples, keeping a subset of faces comprises outputting data corresponding to the subset and/or providing a pointer pointing to a memory space where data corresponding to the subset is stored.

Recognizing S30 the second set of faces comprises recognizing the one or more elementary subsets, i.e. all of them. The definition of an elementary subset has more requirements to be fulfilled, in order to be verified, than the definition of a candidate elementary subset. In other words, a candidate elementary subset is easier and quicker to identify than an elementary subset, because less verifications are required. Thus, instead of directly recognizing all elementary subsets, the method first recognize all subsets (namely the candidate elementary subsets) that partly verify the definition of an elementary subset, which is easier to check than checking that the whole definition is verified, and discards faces (those of the first set which are comprised in no candidate elementary subsets) which have no chance at all to be part of an elementary subset (because they do not comply with at least a part of the definition of an elementary subset). Identifying S320 the elementary subsets is then easier and quicker, first because it is performed on a set of faces which is (e.g. strictly) smaller than the first set of faces (namely the set made of all candidate elementary subsets), and second because, on this set of faces, only a part of the definition of an elementary feature remains to be verified. In other words, instead of recognizing all elementary subsets in one long and difficult step, the method recognizes them all in two shorter and easier steps. The method is thus very efficient.

Examples of the determining S310 of the one or more candidate elementary subsets are now discussed.

In examples, the determining S310 of the one or more candidate elementary subsets includes iteratively visiting faces of the first set. Visiting a face comprises determining whether the face is to be included in a candidate elementary subset. Visiting a face further comprises, if the face is to be included in the candidate elementary subset, including the face in the elementary subset and determining that the face is not to be visited again.

Iteratively visiting faces of the first set means that faces of the first set are visited one at a time (e.g. one by one) and that, at the end, all faces of the first set have been visited. Each time a face is visited, the face is either included in one and only one candidate elementary subset, in which case it cannot be included in another candidate elementary subset, or not included in a candidate elementary subset at the time the face is visited. If the face is included in a candidate elementary subset, a determination is made that the face must not be visited again, because it cannot be part of another candidate elementary subset (by definition of a candidate elementary subset). The determining S310 of the one or more candidate elementary subsets thus partitions efficiently the first set of faces between candidate elementary subsets and other faces that do not belong to any candidate elementary subset, because each time a candidate elementary subset is determined, the set of faces to visit for subsequent determination of candidate elementary subsets is smaller. The method is thus very efficient.

In examples, before the determining S310 of the one or more candidate elementary subsets, all faces of the first set of faces are marked (e.g. labelled) "unvisited". In these examples, the determining S310 comprises running an algorithm which iteratively visits the faces of the first set of faces. The algorithm starts with visiting an initial face of the first set of faces, and the initial face is marked "visited". Marking a face "visited" is determining that the face will not be visited again by the algorithm. The initial face may be chosen (e.g. selected, e.g. provided to the algorithm) randomly among the faces of the first set of faces. The algorithm then iteratively visits all adjacent faces to the initial face and collects all adjacent faces which either share an edge of a predetermined type with the initial face or share a smooth edge with the initial face and are not of a predetermined face type. If the provided feature type is the depression feature type (resp. protrusion feature type), the predetermined face type is the round (resp. fillet) face type and the predetermined edge type is the concave (resp. convex) edge type. All collected adjacent faces are marked "visited". The algorithm then collects all adjacent faces of each previously collected adjacent faces which either share an edge of the predetermined type with the previously collected adjacent face or share a smooth edge with the previously collected adjacent and are not of the predetermined face type, newly collected faces being marked "visited", and so on. The algorithm thus performs an iterative collecting of adjacent faces which results in the identification of the candidate elementary subset comprising the initial face. It is possible that the candidate elementary subset consists in exactly the initial face, i.e. no adjacent face is collected. The algorithm then visits an unvisited face (i.e. a face marked "unvisited") of the first set of faces and re-execute the iterative collecting of adjacent faces of said unvisited face, and so on, until all faces of the first set are marked "visited".

An implementation of the determining S310 of one or more candidate elementary subset is now discussed. In this implementation, the provided feature type is the depression feature type. The determining S310 comprises running a propagation algorithm on the faces of the provided first set of faces. Let F be the first set of faces and n is the number of candidate elementary features. The propagation algorithm is described by the following pseudo-code:

```
n:=0
While exists unvisited face of F do begin
    f:= unvisited face of F
    Set f visited
    n:=n + 1
    L_n:=ElemDepression(f)
End while
```

The function ElemDepression(f) is to iteratively visit adjacent faces of initial face f until a convex edge or a round face is reached. This propagation algorithm makes use of a last-in-first-out (LIFO) list noted H and an output list noted E. The LIFO list is an internal data structure for propagation purpose. It is used through standard instruction Push(•), Pop(•) and Size. Instruction Push(x) adds object x on top of the list and increments its size. Instruction Pop(x) yields the last object of the list, noted x, removes it from the list and decrements its size. The output list E includes faces of the candidate elementary subset initiated with input face f. Function ElemDepression is described by the pseudo-code below.

```
ElemDepression(f)
    E:=E ∪ {f}
    Set face f visited
    Push(f)
    While Size(H) > 0 do begin
        Pop(x)
        For each unvisited boundary edge b of face x do begin
            Set edge b visited
            If edge b is concave then
                y:= the adjacent face of face x sharing edge b
                If face y is unvisited then
                    Push(y)
                    E:=E ∪ {y}
                    Set face y visited
                End if
            Else if edge b is smooth then
                y:= the adjacent face of face x sharing edge b
                If face y is not a round face and is unvisited then
                    Push(y)
                    E:=E ∪ {y}
                    Set face y visited
                End if
            End if
        End for
    End while
Return list E
```

Figure 26:
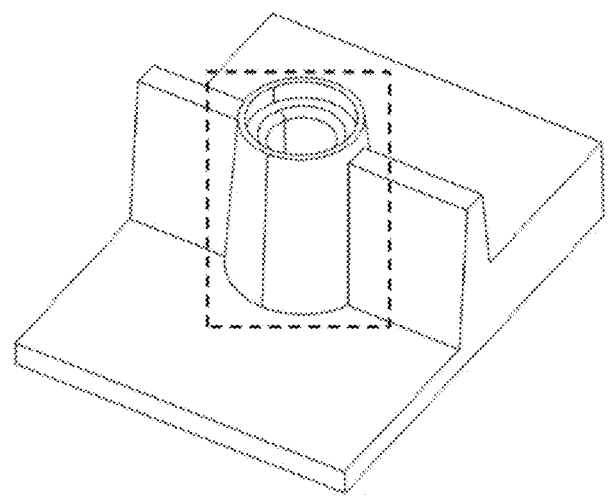
Figure 27:
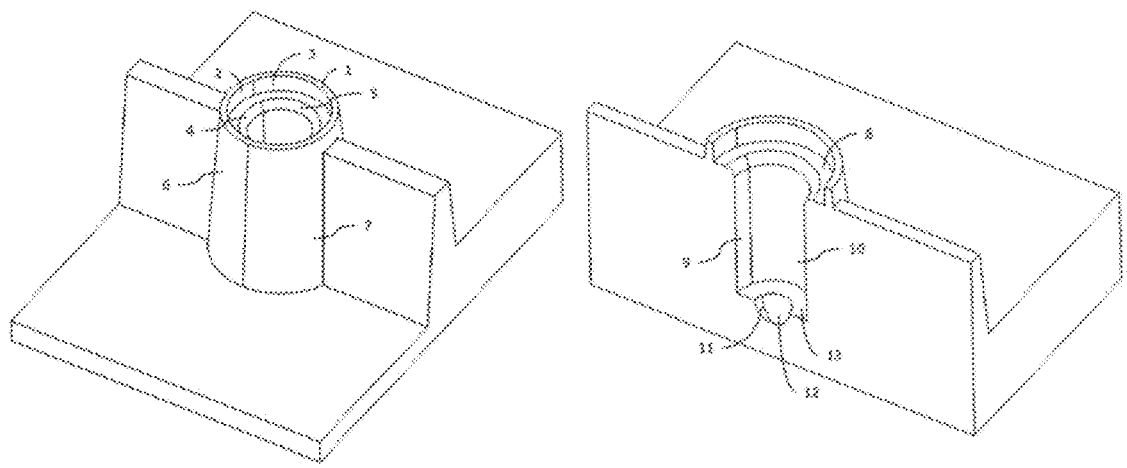
Figure 28:
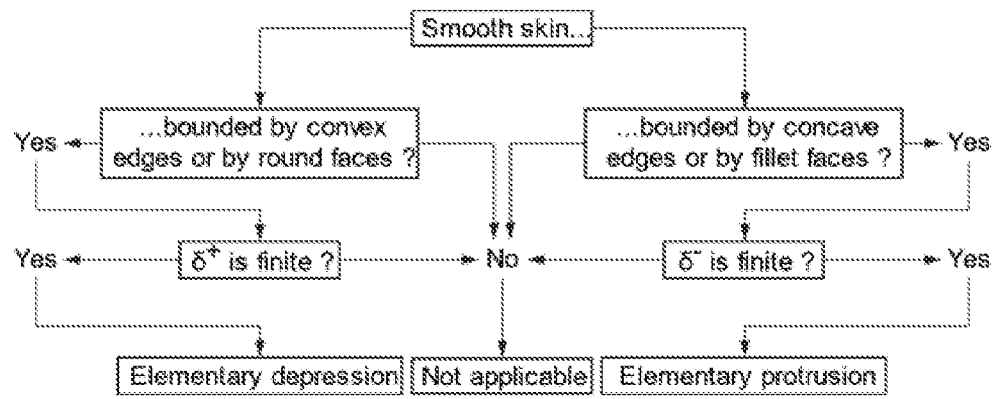

An example of the application of the above propagation algorithm is now discussed with reference to FIGS. 26-27. FIG. 27 shows a provided S10 B-rep. Faces entirely comprised within the dotted rectangle are the faces of the first set of faces. To provide S20 the first set of faces, the user has drawn the dotted rectangle on a display of the CAD system on which the B-rep is displayed. For the sake of clarity, the faces of the first set of faces are numbered, i.e. F={1, . . . , 13}, as illustrated in FIG. 28. Notice that, despite they are selected, faces 11, 12 and 13 are difficult to see, as shown on the right drawing. The propagation algorithm determines S310 the following lists of candidate elementary subsets: $L_1=\{1\}$, $L_2=\{2,3,8\}$, $L_3=\{9,10,13\}$ and $L_4=\{11,12\}$. In this example, candidate elementary subsets $L_2$, $L_3$ and $L_4$ are then identified S320 as elementary subsets, because $L_2$ and $L_3$ are not smooth skins and $L_4$ is a smooth skin satisfying the concavity criterion. $L_1$ is discarded because it is a smooth skin which does not satisfy the concavity criterion.

Another implementation of the determining S310 of one or more candidate elementary subset is now discussed. In this implementation, the provided feature type is the protrusion feature type. The determining S310 comprises running a propagation algorithm on the faces of the provided first set of faces. Let F be the first set of faces and n is the number of candidate elementary features. The propagation algorithm is described by the following pseudo-code:

```
n:=0
While exists unvisited face of F do begin
    f:= unvisited face of F
    Set f visited
    n:=n + 1
    L_n:=ElemProtrusion(f)
End while
```

The function ElemProtrusion(f) is to iteratively visit adjacent faces of initial face f until a concave edge or a fillet face is reached. This propagation algorithm makes use of a last-in-first-out (LIFO) list noted H and an output list noted E. The LIFO list is an internal data structure for propagation purpose. It is used through standard instruction Push(•), Pop(•) and Size. Instruction Push(x) adds object x on top of the list and increments its size. Instruction Pop(x) yields the last object of the list, noted x, removes it from the list and decrements its size. The output list E includes faces of the candidate elementary subset initiated with input face f. Function ElemProtrusion is described by the pseudo-code below.

```
ElemProtrusion(f)
    E:=E ∪ {f}
    Set face f visited
    Push(f)
    While Size(H) > 0 do begin
        Pop(x)
        For each unvisited boundary edge b of face x do begin
            Set edge b visited
            If edge b is convex then
                y:= the adjacent face of face x sharing edge b
                If face y is unvisited then
                    Push(y)
                    E:=E ∪ {y}
                    Set face y visited
                End if
            Else if edge b is smooth then
                y:= the adjacent face of face x sharing edge b
                If face y is not a fillet face and is unvisited then
                    Push(y)
                    E:=E ∪ {y}
                    Set face y visited
                End if
            End if
        End for
    End while
    Return list E
```

In examples, each of the two propagation algorithms of the two above implementations is specifically linked to the provided feature type, i.e. there is exactly one propagation algorithm made for one feature type. In examples, the propagation algorithm is the same for both feature types, but the functions ElemProtrusion or ElemDepression are two different instances of a parameter of the propagation algorithm, said parameter being set (e.g. specified) as a result of providing S20 the feature type.

FIG. 28 shows a flowchart illustrating an implementation of the determining S310 of whether a smooth skin is a candidate elementary subset or not and of the identifying S320 of whether the candidate elementary subset is an elementary subset or not.

In examples the recognizing S30 comprises combining S330 the identified elementary subsets. If the provided feature type is the depression feature type, two elementary subsets are combined if they share only convex edges or if they are adjacent to the same set of one or more round faces, in which case the one or more round faces are combined with the two elementary subsets. Additionally or alternatively, if the provided feature type is the depression feature type, two elementary subsets are combined if they share only concave edges or if they are adjacent to the same set of one or more fillet faces, in which case the one or more fillet faces are combined with the two elementary subsets.

Combining S330 the elementary subsets comprises forming the connection between all elementary subsets that is the second set of faces. In other words, combining the elementary subsets forms and/or outputs the second set of faces. Forming the connection comprises forming (e.g. iteratively, e.g. one by one) each interface between each two elementary subsets which ought to be connected, i.e. two subsets sharing either only edges of the predetermined edge type or only faces of the predetermined face type.

In examples, the combining S330 consists in that all faces of the set of faces are merged to form data corresponding to the second set of faces. In examples, as a result of the recognizing S30, there is a pointer that points to a memory space where all data relative to all faces of the second set of faces is stored.

In the example, previously described with reference to FIGS. 26-27, elementary subsets $L_3$ and $L_4$ are combined into the subset $C_1=\{9,10,11,12,13\}$ because they share convex edges only. In addition, $C_1$ and $L_2$ are combined because they share round faces 4 and 5, which yields the second set of faces $C_2=\{2,3,4,5,8,9,10,11,12,13\}$.

The invention claimed is:

1. A computer-implemented method for designing, with a computer-aided design system, a three-dimensional modeled object representing a mechanical part, the method comprising:
   obtaining a boundary representation representing the mechanical part, the boundary representation having faces and edges, the boundary representation being displayed;
   graphically selecting, by graphical user interaction with the displayed boundary representation, a first set of faces on the displayed boundary representation;
   obtaining a feature type, the feature type being either a depression feature type or a protrusion feature type; and
   automatically by the computer-aided design system, recognizing a second set of faces within the first set of faces, the second set of faces representing a feature of the provided feature type,
   wherein the second set of faces forms a connection between one or more elementary subsets, and wherein, a smooth skin being a face or a connected set of faces containing only smooth internal edges:
      if the obtained feature type is the depression feature type, an elementary subset in the connection is a connected set of one or more faces bounded by convex edges or round faces only and containing no convex internal edge and no round face in that the one or more faces do not comprise any round face and any edge shared by two faces of the one or more face is not a convex edge, the elementary subset being either not a smooth skin or a smooth skin satisfying a concavity criterion, and
      if the obtained feature type is the protrusion feature type, an elementary subset in the connection is a connected set of one or more faces bounded by concave edges or fillet faces only and containing no concave internal edge and no fillet face in that the one or more faces do not comprise any fillet face and any edge shared by two faces of the one or more face is not a concave edge, the elementary subset being either not a smooth skin or a smooth skin satisfying a convexity criterion, wherein the second set of faces comprises all elementary subsets of the first set,
   wherein each elementary subset is connected to at least one other elementary subset, two elementary subsets being connected if they share either only edges of a predetermined edge type or only faces of a predetermined face type, where:
      if the obtained feature type is the depression feature type, the predetermined edge type is the convex edge type and the predetermined face type is the round face type, and if the obtained feature type is the protrusion feature type, the predetermined edge type is the concave edge type and the predetermined face type is the fillet face type, wherein:
a smooth skin bounded by convex edges or round faces only and containing no convex internal edge and no round face satisfies the concavity criterion when the smooth skin cannot be arbitrarily offset in the direction of its normal vector while remaining smooth, and
a smooth skin bounded by concave edges or fillet faces only and containing no concave internal edge and no fillet face satisfies the convexity criterion when the smooth skin cannot be arbitrarily offset in the opposite direction of its normal vector while remaining smooth, wherein the recognizing further includes:
determining one or more candidate elementary subsets, where:
if the obtained feature type is the depression feature type, a candidate elementary subset is a connected set of one or more faces bounded by convex edges or round faces only and containing no convex internal edge and no round face, and
if the obtained feature type is the protrusion feature type, a candidate elementary subset is a connected set of one or more faces bounded by concave edges or fillet faces only and containing no concave internal edge and no fillet face,
wherein the determining of the one or more candidate elementary subsets partitioning the first set of faces into faces which each belong to exactly one candidate elementary subset and faces which belong to no candidate elementary subset; and
identifying the one or more elementary subsets among the determined candidate elementary subsets.

2. The method of claim 1, wherein the determining the one or more candidate elementary subsets includes iteratively visiting faces of the first set, where visiting a face further including:
determining whether the face is to be included in a candidate elementary subset, and
when the face is to be included in the candidate elementary subset, including the face in the elementary subset and determining that the face is not to be visited again.

3. The method of claim 1, wherein the selecting of the first set of faces includes:
by graphical user-interaction, defining a closed curve on the display, and
automatically by the computer-aided design system, identifying each face of the boundary representation of which projection on the display is entirely included inside the closed curve.

4. The method of claim 3, wherein the selecting of the first set of faces further includes, automatically by the computer-aided design system:
partitioning the identified faces into disjoint connected subsets of faces, where one and only one subset is the first set of faces; and
discarding all other subsets.

5. The method of claim 1, wherein the mechanical part is:
a molded part,
a machined part,
a drilled part,
a turned part,
a forged part,
a stamped pan, and/or
a folded part.

6. The method of claim 1, wherein:
when the feature type is the depression feature type, the feature of the obtained feature type is:
a mass reduction feature,
a space reservation feature,
a fixture feature,
a tightness feature,
an adjustment feature,
a positioning feature,
a mechanical joint feature,
a cooling feature,
a space reservation feature,
a revolute or cylindrical mechanical joint feature,
an assembly feature, and/or
a stiffening feature, and/or
when the feature type is the protrusion feature type, the feature of the provided feature type is:
a stiffening feature,
a fixture feature,
a positioning pin feature,
a revolute or cylindrical mechanical joint feature,
a support for all machined and drilled protrusions feature,
an assembly feature, and/or
a space reservation feature.

7. The method of claim 1, wherein in processing the second set of faces, the processing includes one or more of:
extracting the second set of faces from the boundary representation;
displaying the second set of faces;
highlighting the second set of faces within a display of the boundary representation; and/or
editing the second set of faces.

8. A non-transitory data storage medium having recorded thereon a computer program comprising instructions for performing a method for designing, with a computer-aided design system, a three-dimensional modeled object representing a mechanical part, the method comprising:
obtaining a boundary representation representing the mechanical part, the boundary representation having faces and edges, the boundary representation being displayed;
graphically selecting, by graphical user interaction with the displayed boundary representation, a first set of faces on the displayed boundary representation;
obtaining a feature type, the feature type being either a depression feature type or a protrusion feature type; and
automatically by the computer-aided design system, recognizing a second set of faces within the first set of faces, the second set of faces representing a feature of the provided feature type,
wherein the second set of faces forms a connection between one or more elementary subsets, and wherein, a smooth skin being a face or a connected set of faces containing only smooth internal edges:
if the obtained feature type is the depression feature type, an elementary subset in the connection is a connected set of one or more faces bounded by convex edges or round faces only and containing no convex internal edge and no round face in that the one or more faces do not comprise any round face and any edge shared by two faces of the one or more face is not a convex edge, the elementary subset being either not a smooth skin or a smooth skin satisfying a concavity criterion, and if the obtained feature type is the protrusion feature type, an elementary subset in the connection is a connected set of one or more faces bounded by concave edges or fillet faces only and containing no concave internal edge and no fillet face in that the one or more faces do not comprise any fillet face and any edge shared by two faces of the one or more face is not a concave edge, the elementary subset being either not a smooth skin or a smooth skin satisfying a convexity criterion, wherein the second set of faces comprises all elementary subsets of the first set, wherein each elementary subset is connected to at least one other elementary subset, two elementary subsets being connected if they share either only edges of a predetermined edge type or only faces of a predetermined face type, where:

if the obtained feature type is the depression feature type, the predetermined edge type is the convex edge type and the predetermined face type is the round face type, and if the obtained feature type is the protrusion feature type, the predetermined edge type is the concave edge type and the predetermined face type is the fillet face type, wherein:

a smooth skin bounded by convex edges or round faces only and containing no convex internal edge and no round face satisfies the concavity criterion when the smooth skin cannot be arbitrarily offset in the direction of its normal vector while remaining smooth, and a smooth skin bounded by concave edges or fillet faces only and containing no concave internal edge and no fillet face satisfies the convexity criterion when the smooth skin cannot be arbitrarily offset in the opposite direction of its normal vector while remaining smooth, wherein the recognizing further includes:

determining one or more candidate elementary subsets, where:

if the obtained feature type is the depression feature type, a candidate elementary subset is a connected set of one or more faces bounded by convex edges or round faces only and containing no convex internal edge and no round face, and if the obtained feature type is the protrusion feature type, a candidate elementary subset is a connected set of one or more faces bounded by concave edges or fillet faces only and containing no concave internal edge and no fillet face, wherein the determining of the one or more candidate elementary subsets partitioning the first set of faces into faces which each belong to exactly one candidate elementary subset and faces which belong to no candidate elementary subset; and identifying the one or more elementary subsets among the determined candidate elementary subsets.

9. A computer comprising:

a processor coupled to a memory and a display, the memory having recorded thereon a computer program comprising instructions for designing, with a computer-aided design system, a three-dimensional modeled object representing a mechanical part that when executed by the processor causes the processor to be configured to:

obtain a boundary representation representing the mechanical part, the boundary representation having faces and edges, the boundary representation being displayed, graphically select, by graphical user interaction with the displayed boundary representation, a first set of faces on the displayed boundary representation;

obtain a feature type, the feature type being either a depression feature type or a protrusion feature type, and automatically by the computer-aided design system, recognize a second set of faces within the first set of faces, the second set of faces representing a feature of the provided feature type, wherein the second set of faces forms a connection between one or more elementary subsets, and wherein, a smooth skin being a face or a connected set of faces containing only smooth internal edges:

if the obtained feature type is the depression feature type, an elementary subset in the connection is a connected set of one or more faces bounded by convex edges or round faces only and containing no convex internal edge and no round face in that the one or more faces do not comprise any round face and any edge shared by two faces of the one or more face is not a convex edge, the elementary subset being either not a smooth skin or a smooth skin satisfying a concavity criterion, and if the obtained feature type is the protrusion feature type, an elementary subset in the connection is a connected set of one or more faces bounded by concave edges or fillet faces only and containing no concave internal edge and no fillet face in that the one or more faces do not comprise any fillet face and any edge shared by two faces of the one or more face is not a concave edge, the elementary subset being either not a smooth skin or a smooth skin satisfying a convexity criterion, wherein the second set of faces comprises all elementary subsets of the first set, wherein each elementary subset is connected to at least one other elementary subset, two elementary subsets being connected if they share either only edges of a predetermined edge type or only faces of a predetermined face type, where:

if the obtained feature type is the depression feature type, the predetermined edge type is the convex edge type and the predetermined face type is the round face type, and if the obtained feature type is the protrusion feature type, the predetermined edge type is the concave edge type and the predetermined face type is the fillet face type, wherein:

a smooth skin bounded by convex edges or round faces only and containing no convex internal edge and no round face satisfies the concavity criterion when the smooth skin cannot be arbitrarily offset in the direction of its normal vector while remaining smooth, and a smooth skin bounded by concave edges or fillet faces only and containing no concave internal edge and no fillet face satisfies the convexity criterion when the smooth skin cannot be arbitrarily offset in the opposite direction of its normal vector while remaining smooth, wherein the recognizing further includes:

determining one or more candidate elementary subsets, where:

if the obtained feature type is the depression feature type, a candidate elementary subset is a connected set of one or more faces bounded by convex edges or round faces only and containing no convex internal edge and no round face, and if the obtained feature type is the protrusion feature type, a candidate elementary subset is a connected set of one or more faces bounded by concave edges or fillet faces only and containing no concave internal edge and no fillet face, wherein the determining of the one or more candidate elementary subsets partitioning the first set of faces into faces which each belong to exactly one candidate elementary subset and faces which belong to no candidate elementary subset; and identify the one or more elementary subsets among the determined candidate elementary subsets.

\* \* \* \* \*